(12) United States Patent
Vorhaus

(10) Patent No.: US 8,759,924 B1
(45) Date of Patent: Jun. 24, 2014

(54) MONOLITHIC INTEGRATION OF MULTIPLE COMPOUND SEMICONDUCTOR FET DEVICES

(71) Applicant: James L. Vorhaus, Chapel Hill, NC (US)

(72) Inventor: James L. Vorhaus, Chapel Hill, NC (US)

(73) Assignee: Sarda Technologies, Inc., Chapel Hill, NC (US)

( * ) Notice: Subject to any disclaimer, the term of this patent is extended or adjusted under 35 U.S.C. 154(b) by 0 days.

(21) Appl. No.: 13/908,871

(22) Filed: Jun. 3, 2013

Related U.S. Application Data

(60) Division of application No. 13/441,644, filed on Apr. 6, 2012, now Pat. No. 8,541,271, which is a continuation of application No. 13/270,145, filed on Oct. 10, 2011, now Pat. No. 8,274,121, which is a continuation of application No. 13/205,433, filed on Aug. 8, 2011, now Pat. No. 8,519,916.

(60) Provisional application No. 61/372,513, filed on Aug. 11, 2010.

(51) Int. Cl.
*H01L 27/088* (2006.01)

(52) U.S. Cl.
USPC ........... 257/401; 257/206; 257/288; 257/341; 438/197; 438/283; 438/284; 438/286

(58) Field of Classification Search
USPC .......... 257/E21.623, E21.637, 202, 206, 208, 257/209, 211, 287, 288, 341, 902, 401; 438/FOR. 424, 128, 587, 129, 193, 195, 438/286, 284, 197, 176, 283
See application file for complete search history.

(56) References Cited

U.S. PATENT DOCUMENTS

| | | | |
|---|---|---|---|
| 4,636,825 A * | 1/1987 | Baynes | 257/401 |
| 5,289,040 A * | 2/1994 | Rogers | 257/666 |

* cited by examiner

*Primary Examiner* — Thanh Y Tran
(74) *Attorney, Agent, or Firm* — Carr & Ferrell LLP

(57) ABSTRACT

Various aspects of the technology provide a dual semiconductor power and/or switching FET device to replace two or more discrete FET devices. Portions of the current may be distributed in parallel to sections of the source and drain fingers to maintain a low current density and reduce the size while increasing the overall current handling capabilities of the dual FET. Application of the gate signal to both ends of gate fingers, for example, using a serpentine arrangement of the gate fingers and gate pads, simplifies layout of the dual FET device. A single integral ohmic metal finger including both source functions and drain functions reduces conductors and contacts for connecting the two devices at a source-drain node. Heat developed in the source, drain, and gate fingers may be conducted through the vias to the electrodes and out of the device.

19 Claims, 20 Drawing Sheets

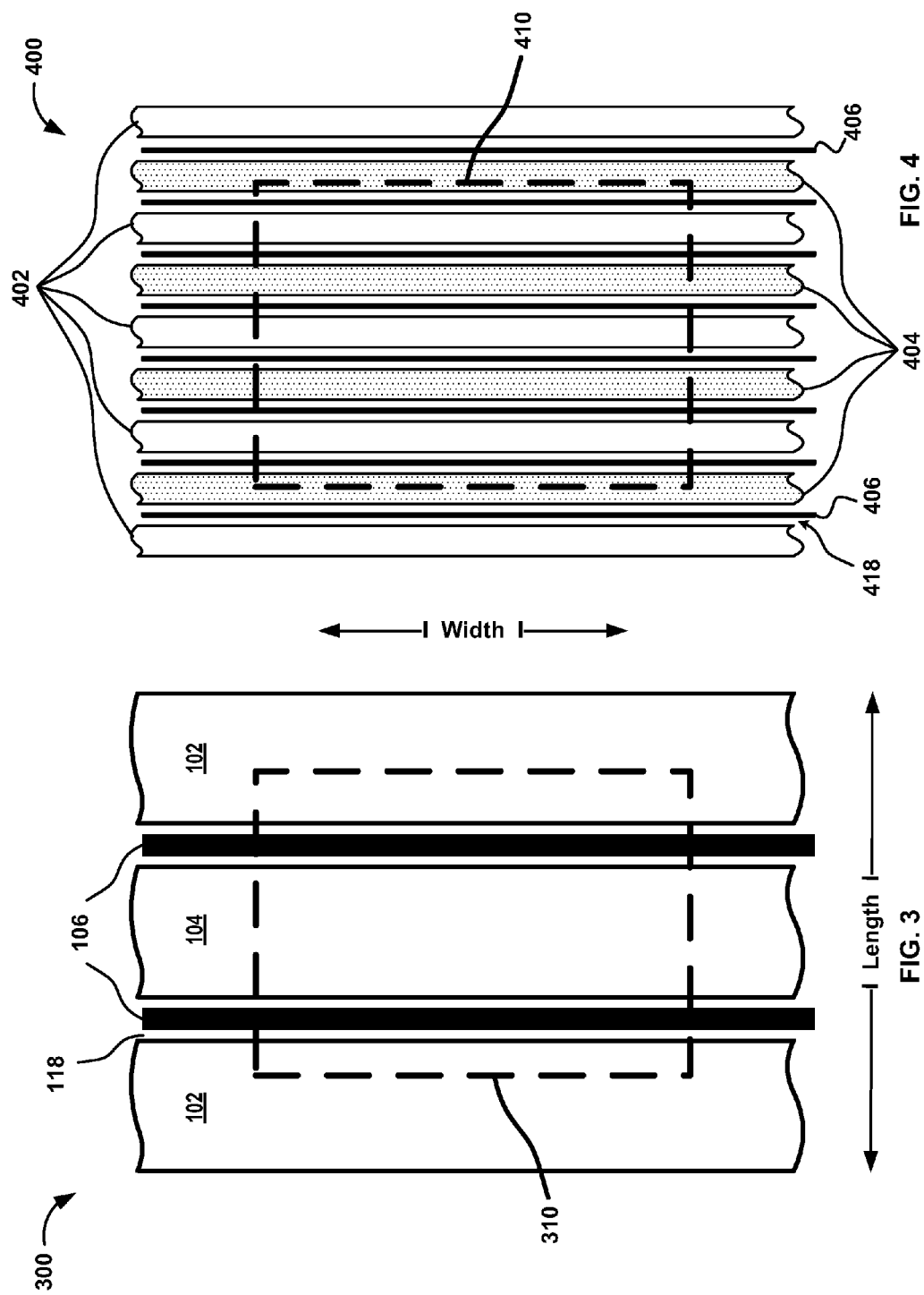

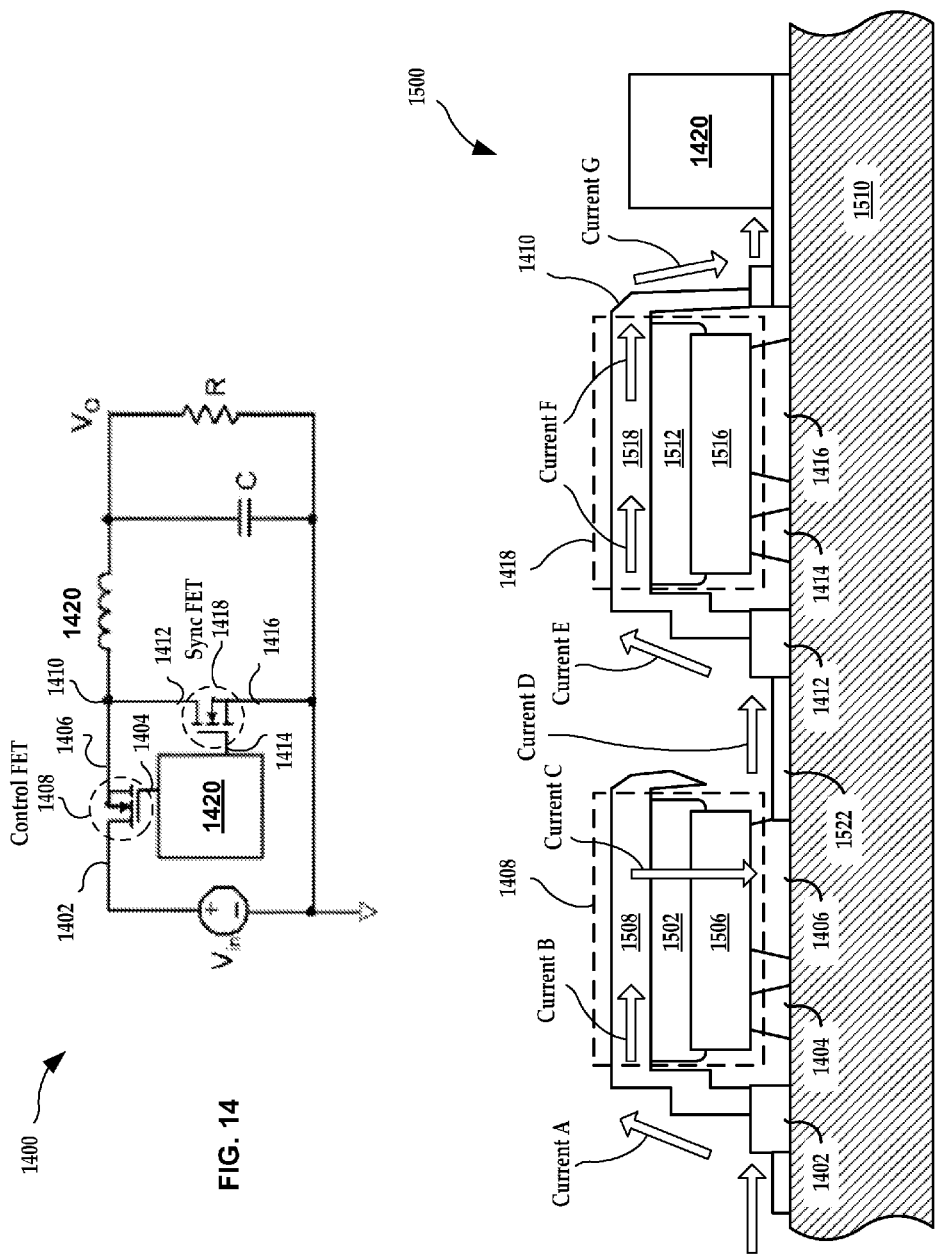

US 8,759,924 B1

MONOLITHIC INTEGRATION OF MULTIPLE COMPOUND SEMICONDUCTOR FET DEVICES

CROSS REFERENCE TO RELATED APPLICATIONS

This application is a divisional of and claims the priority benefit of U.S. patent application Ser. No. 13/441,644, filed Apr. 6, 2012, and titled, "Monolithic Integration of Multiple Compound Semiconductor FET Devices," which is a continuation of and claims the priority benefit of U.S. patent application Ser. No. 13/270,145, filed Oct. 10, 2011, and titled, "Compound Field Effect Transistor with Multi-Feed Gate and Serpentine Interconnect," which is continuation of and claims the priority benefit of U.S. patent application Ser. No. 13/205,433, filed Aug. 8, 2011, and titled "Low Interconnect Resistance Integrated Switches," which in turn claims the priority benefit of U.S. provisional application No. 61/372,513, filed Aug. 11, 2010, and titled "Field Effect Transistor and Method of Making Same." This application is also related to U.S. patent application Ser. No. 13/364,258, filed Feb. 1, 2012, and titled "Self Clamping FET Devices in Circuits Using Transient Sources." The above referenced applications are hereby incorporated by reference in their entirety.

TECHNICAL FIELD

The present invention relates to semiconductors devices, and more particularly to compound semiconductor Field Effect Transistor switches and power FETs.

BACKGROUND

A common type of Field Effect Transistors (FET) is a Metal-Oxide-Semiconductor Field Effect Transistor (MOSFET), which may be fabricated using silicon. A FET may also be fabricated using germanium or a compound semiconductor such as gallium arsenide (GaAs) or gallium nitride (GaN). FET devices fabricated from compound semiconductors such as GaAs make very good switches and signal amplification devices for rf and microwave applications. Among these devices are switches and large-signal (or power) amplifier circuits. Some advantages of compound semiconductor FET switches over silicon MOSFET switches include high blocking (off-state) resistance, low on-state resistance ($R_{DS}$ (on)), fast switching speed, high current density, low temperature coefficient, high junction temperature and, for GaN devices, high breakdown voltage. Unfortunately, compound semiconductor FET switches and power FETs are also more expensive to manufacture than silicon MOSFETs due to the larger size of the FETs necessary to handle power, smaller wafers and higher fabrication expenses. Merely decreasing the size of compound semiconductors by scaling down the device may not decrease costs.

SUMMARY

Device cost of a compound semiconductor switching or power FET is driven by two factors, namely size and yield. The present invention addresses both. Reducing the size while maintaining current handling capabilities is accomplished by distributing portions of the current handled by the device in parallel to sections of the source and drain fingers to maintain a low current density and eliminate the need for outboard bonding pads. Increasing yield is accomplished by applying the gate signal to both ends of the gate fingers, which eliminates a major source of device failure, i.e., a break in any single one of the many gate fingers. The current to be handled by the FET may be divided among a set of electrodes arrayed along the width of the source or drain fingers. The electrodes may be oriented to cross the fingers along the length of the array of source and drain fingers. The portion of the current distributed to each source electrode may be coupled to a section of each source finger crossed by the source electrode. Similarly, the portion of the current distributed to each drain electrode may be applied to a section of each drain finger crossed by the drain electrode. The current may be conducted from the source and drain electrodes to the source and drain fingers, respectively, through vias disposed along the surface of the fingers. Heat developed in the source, drain, and gate fingers may be conducted through the vias to the electrodes and out of the device. Moreover, the overall size of a circuit including two discrete FET devices, such as a control FET and a sync FET may be reduced in size and cost by integrating the control FET and the sync FET as a single compound semiconductor device and fabricating the source of the control FET and the drain of the sync FET as a single set of continuous integral ohmic metal fingers. Serpentine gate structure may accommodate a node between contiguous source and drain fingers (e.g. a source finger of a control FET and a drain finger of a sync FET).

Various aspects of a dual Field Effect Transistor (FET) device include a compound semiconductor layer and a control FET fabricated on the compound semiconductor layer. The control FET includes an ohmic metal control source finger and an ohmic metal control drain finger disposed on a surface of the compound semiconductor layer, a control gate finger between the control source finger and the control drain finger, and a first and second control gate pad at opposite ends of the control gate finger and in electrical contact with the control gate finger. The dual FET device further includes a sync FET fabricated on the compound semiconductor layer with the control FET as a monolithic device. The sync FET includes an ohmic metal sync source finger and an ohmic metal sync drain finger disposed on the surface of the compound semiconductor layer, a sync gate finger between the sync source finger and the sync drain finger, and a first and second sync gate pad at opposite ends of the sync gate finger and in electrical contact with the sync gate finger, the first control gate pad and the first sync gate pad disposed between the control drain finger and the sync source finger. The dual FET device also includes a node between the control source finger and the sync drain finger. The control source finger and the sync drain finger form a continuous ohmic metal finger including the node.

Various aspects of a method for switching current using a control FET and a sync FET include partitioning a current into a plurality of current segments and distributing the plurality of current segments to sections of a control drain element of a control FET, the current segments distributed through a plurality of vias distributed along a surface of the control drain current element. The method further includes coupling a control gate signal to a first and second end of a control gate finger disposed between the control drain element and a control source element of the control FET, switching the plurality of current segments from the control drain element to the control source element using the control gate, and conducting the switched current segments along a continuous ohmic metal from the control source element of the control FET to a sync drain element of the sync FET. The method also includes extracting the plurality of current segments from sections along the sync drain element through a plurality of vias distributed along a surface of the sync drain element.

In various embodiments, the Field Effect Transistor device comprises a compound semiconductor layer, a plurality of control source fingers and sync source fingers disposed on a surface of the semiconductor layer, and a plurality control drain fingers and sync drain disposed on the surface of the semiconductor layer, the control drain fingers alternating with the control source fingers, and the sync drain fingers alternating with the sync source fingers, each of the plurality of control source fingers integrally connected to and forming a continuous ohmic metal with a corresponding sync drain finger. A plurality of control gates may be disposed between adjacent control source fingers and control drain fingers, and a plurality of sync gates may be disposed between adjacent sync source fingers and sync drain fingers. A plurality of first control gate pads may be disposed opposite the control gate fingers from a plurality of second control gate pads, each of the first and second control gate pads configured to couple a control gate signal to two of the control gate fingers. Each of the plurality of second control gate pads may be disposed between one of the plurality of control drain fingers and a respective sync source finger. A plurality of first sync gate pads may be disposed opposite the sync gate fingers from a plurality of second sync gate pads, each of the first and second sync gate pads configured to couple a sync gate signal to two of the sync gate fingers. Each of the plurality of second sync gate pads may be disposed between one of the plurality of control drain fingers and a respective sync source finger.

BRIEF DESCRIPTION OF THE DRAWINGS

FIG. 3 is a plan view illustrating a typical unit cell of section of active device area of the FET of FIG. 1.

FIG. 4 illustrates a unit cell of a section of a reduced size for a compound semiconductor FET, in accordance with embodiments of the technology.

FIG. 14 illustrates a typical circuit diagram for a buck converter.

FIG. 15 illustrates an elevation view of a prior art implementation of the buck converter circuit of FIG. 14.

DETAILED DESCRIPTION

Figure 1:
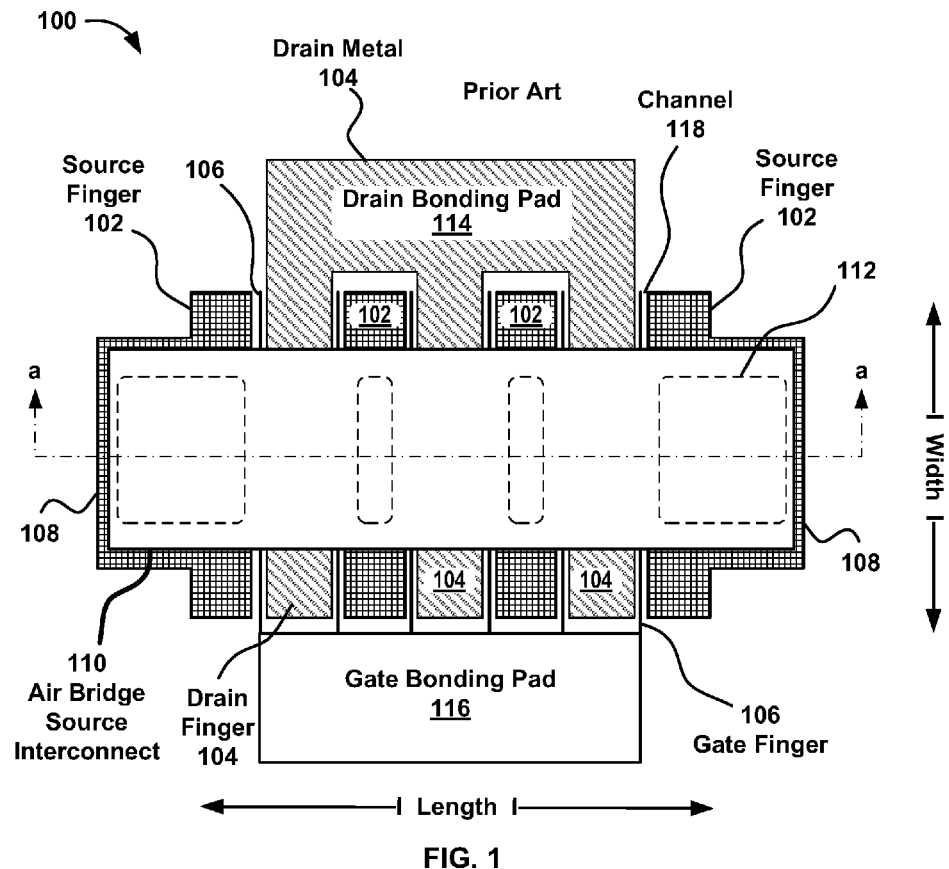
FIG. 1 shows a diagram of a conventional layout for a prior art large periphery power FET.
Figure 2:
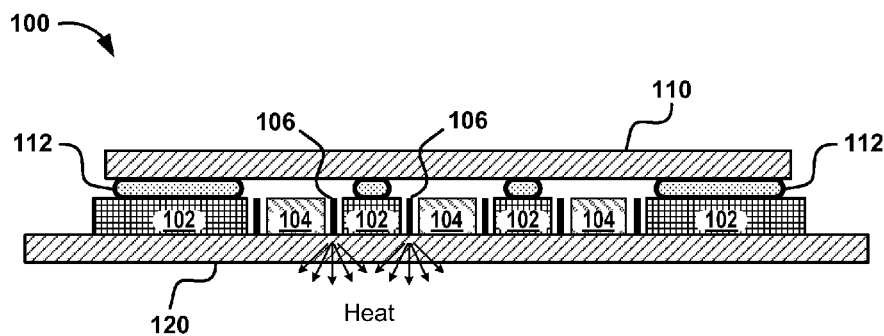
FIG. 2 is a cross section view of the FET of FIG. 1 along line a-a.

FIG. 1 shows a block diagram of a conventional layout for a prior art large periphery power FET 100. FIG. 2 is a cross section view of the FET 100 of FIG. 1 along line a-a. The FET 100 includes source fingers 102, drain fingers 104 and gate fingers 106. The source fingers 102 and drain fingers 104 may be ohmic metal fabricated on an N-type or P-type semiconductor 120, (or compound semiconductor epitaxial layer) which is disposed on a semi-insulating substrate (not illustrated) such as silicon or GaAs. The term ohmic metal is used to refer specifically to source metal, which is metal used in source fingers, and to drain metal, which is metal used in drain fingers. Source and drain metal may be in low resistance contact with the compound semiconductor epitaxial layer. This may be achieved by depositing a specific set of materials (e.g., Au, Ge, and/or Ni) then heating the wafer so that the metals alloy (or diffuse) into the epitaxial layer creating the low resistance connections. In some embodiments, gate metal, which is used in gate fingers, comprises a set of deposited metals (e.g., Ti, Pt, Au, and/or Al). Gate metal forms a Schottky contact with the surface of the epitaxial layer, creating the Schottky diode structure in the region of epitaxial layer that comprises the gate region.

In operation, current flows between the source fingers 102 and the drain fingers 104. The amount of current flowing is controlled by a voltage applied to the gate fingers 106. The FET 100 further includes a drain pad 114, source pad 108, and a gate pad 116. An air bridge 110 provides interconnections between the source fingers 102, through contacts 112 to the source fingers 102 and to the source pads 108. The contacts 112 are shown in dotted line to indicate that they are between the air bridge 110 and the source fingers 102 or source pad 108. A length of the source fingers 102, drain fingers 104, and gate fingers is measured in the horizontal axis as illustrated FIG. 1 and is generally the short dimension. A width of the source fingers 102, drain fingers 104, and gate fingers is measured in the vertical axis as illustrated FIG. 1 and is generally the long dimension. A "gate periphery" may be a measurement of an active area of a FET (or an active region of the FET under consideration). The gate periphery is generally a number of gate fingers distributed along the length of the device (the horizontal axis in FIG. 1) times the width of the gate fingers (in the long axis or vertical axis of FIG. 1). For example, a FET (or a region of a FET) that has 100 gate fingers, each 1 mm in width, has a gate periphery of 100 mm.

A device such as the FET 100 has a large footprint requiring a great deal of expensive wafer surface. This large die size is generally driven by a number of factors: The first factor is a requirement for many source and drain fingers in the active area of the device to support a large gate periphery. The second factor is a requirement that the drain fingers 104 are long enough (in the horizontal direction in FIG. 1) to conduct current without failing due to generating too much heat. The third factor is that the length of the source fingers 102 is driven by the process technology used to form the air bridge, thus, source fingers 102 must be long enough (in the horizontal direction in FIG. 1) to accommodate the contacts 112 to the air bridge 110. The fourth factor is a requirement for large outboard pads, e.g., the drain pad 114, the source pads 108, and the gate pad 116.

FIG. 3 is a plan view illustrating a typical unit cell 310 of section 300 of active device area of the FET 100 of FIG. 1. The source fingers 102 and drain fingers 104 are 30 microns each in length and the channels 118 in which the gate fingers 106 are positioned are 5 microns in length. Thus, an example unit cell 310 of the device (represented by a dotted line rectangle) having a 70 micron length×100 micron width (7,000 sq. microns) would encompass two gates, each 100 microns wide, or 200 microns of gate periphery or "active" device area.

GaAs devices typically have a specific resistivity of around one ohm-mm, so in order to achieve on-state resistances in the milliohm range, very large FETs, with gate peripheries on the order of hundreds of millimeters, are required. This large gate periphery is the major yield driver (and major cost factor) in the manufacturing of such devices. Thus, a device as illustrated in FIG. 3 might require about 7,000,000 square microns (7 mm$^2$) of active device area, in addition to peripheral pads to achieve 200 mm of gate periphery.

FIG. 4 illustrates a unit cell 410 of a section 400 of a reduced size for a compound semiconductor FET, in accordance with embodiments of the technology. The size of a compound semiconductor FET device may be reduced by reducing widths of the source fingers 402 and drain fingers 404 as illustrated in FIG. 4. For example, a source finger 402 and a drain finger 404, each having a length of about 7 microns may produce about three times the gate periphery in about the same size unit cell 410 (about 72×100 microns as illustrated in FIG. 4). Note that it may not be practical to shrink the length of the channel 118 in proportion to the unit cell because of various device performance restrictions such as breakdown voltage. Note also that because of the symmetrical nature of the ohmic metal structure of a FET, source and drain fingers may be interchangeable. The embodiment illustrated in FIG. 4 may achieve 600 mm of gate periphery in the unit cell 410 which is about same size as the unit cell 310.

As it turns out, there are a number of barriers to simply scaling a FET device such as illustrated in the section 300 of FIG. 3 down to a FET device as illustrated in the section 400 of FIG. 4. As discussed above, there is a limit to how much the length the drain fingers 104 can be reduced and still carry adequate current from the pad 114 through the entire width of the drain fingers 104. As the cross section of source fingers 102 and the drain fingers 104 decreases metal migration occurs in the direction of the current, further decreasing the cross section. Further, as the cross section of the fingers decrease the resistance in the fingers increases. A practical limit for reduction of the length of the source fingers and the drain fingers 104 is about 30 microns.

Moreover, there are additional limits to simply scaling down various component parts of a FET device. For example, scaling down the length of the gate fingers 106 can result in an increase in defect rates due to breaks in the fingers 106. This in turn can reduce yield. It turns out that as the length of the gate fingers is reduced, the probability of a break in the gate fingers 106 increases. For example, a reduction in length of the gate fingers 106 to about 0.25-0.5 microns could substantially decrease a yield for a FET device having a 1 meter gate, to less than 40%. While, reducing the length of the gate fingers 106 may have limited bearing on the total size of a FET, there may be other reasons for wishing to decrease the length.

Another limit to scaling down a FET device turns out to be a limitation on spacing between gate fingers 106 (gate pitch) imposed by temperature control. Most of the heat is generated in the FET device 100 and is generated under the gates 106 and is conducted out of the device through the semiconductor 120 and the substrate. A compound semiconductor such as GaAs is a rather poor thermal conductor. The heat tends to propagate in a spreading action away from gates 106 through the semiconductor 120 and substrate at about 45 degrees, as illustrated in FIG. 2. The heat spreading action tends to increase the area through which heat is removed from the gate region and improves efficiency for removing heat from the gate region. However, as the FET device is scaled down, heat propagating at 45 degrees from adjacent gate fingers 106 interferes with the spreading action, and efficiency of the conduction of heat through the semiconductor 120 and substrate decreases. Yet another barrier is that the air bridge 110 illustrated in FIG. 1 is precluded because of the narrow source fingers 402.

Figure 5A:
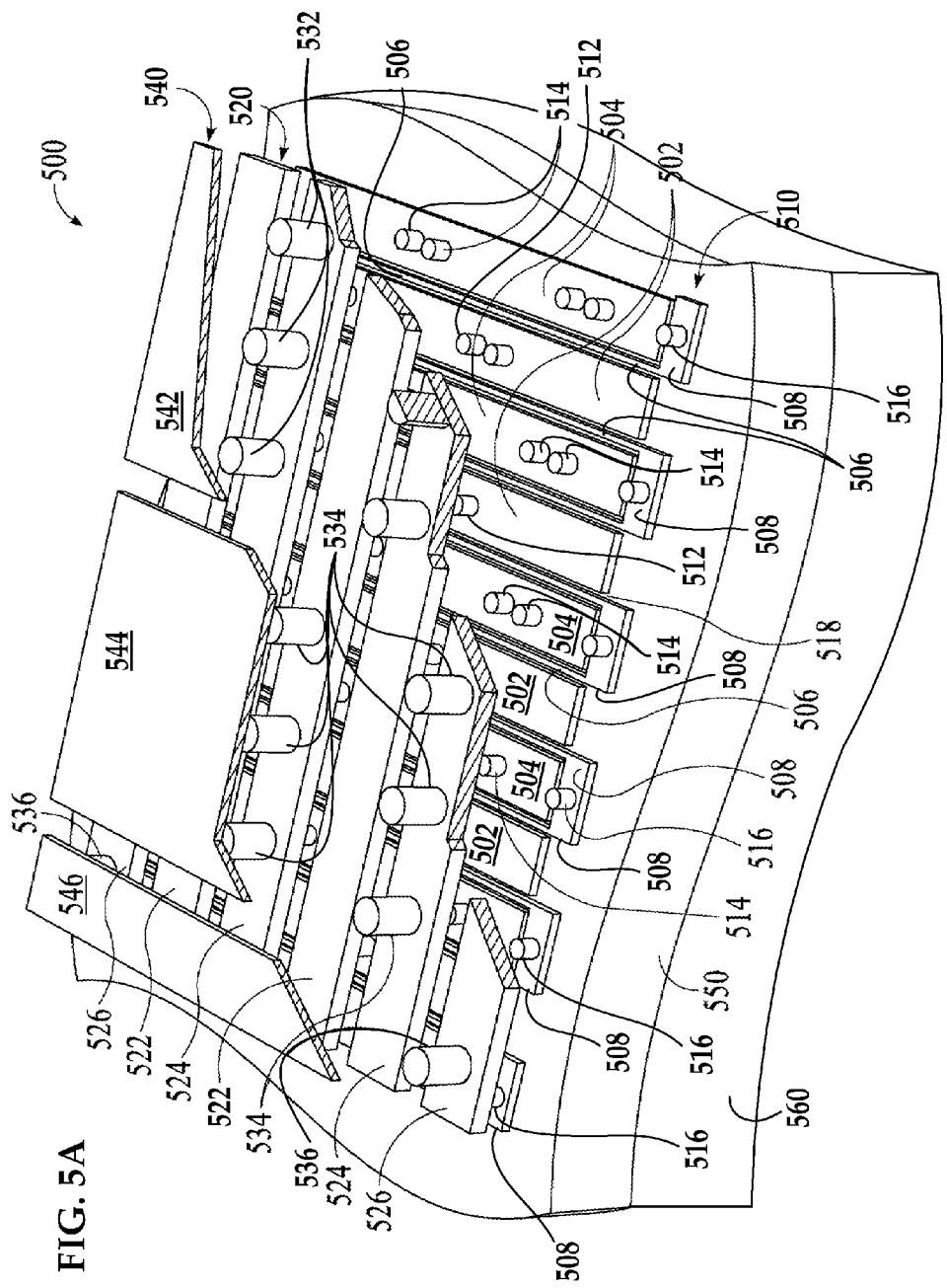
FIG. 5A is a perspective cutaway view of a block diagram for a FET device according to various aspects of the technology.
Figure 5B:
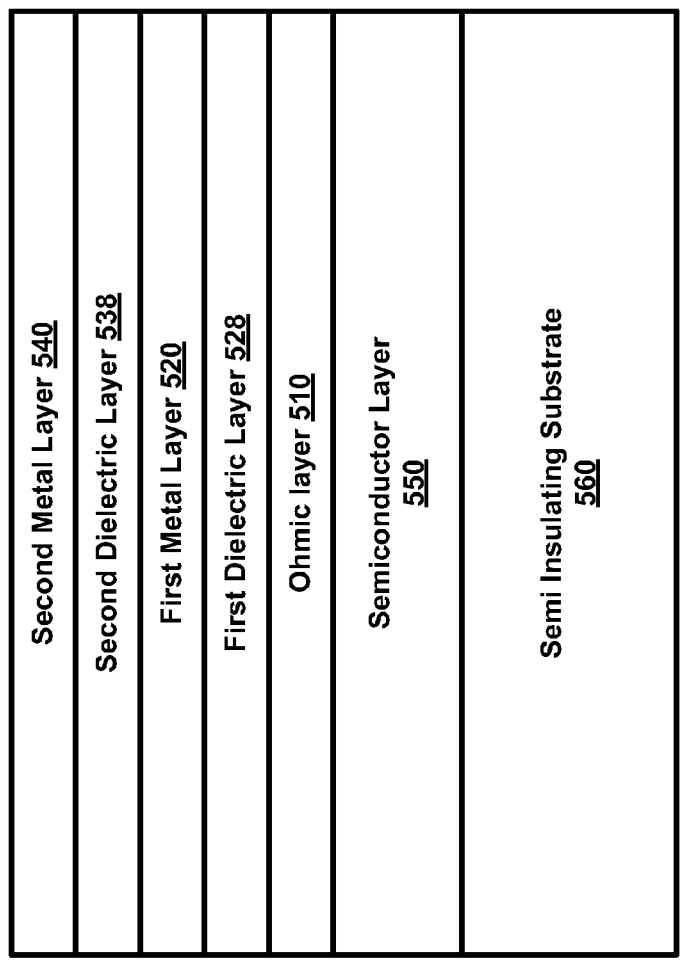
FIG. 5B is a block diagram of a side elevation illustrating layers of the FET device 500 of FIG. 5A.
Figure 6:
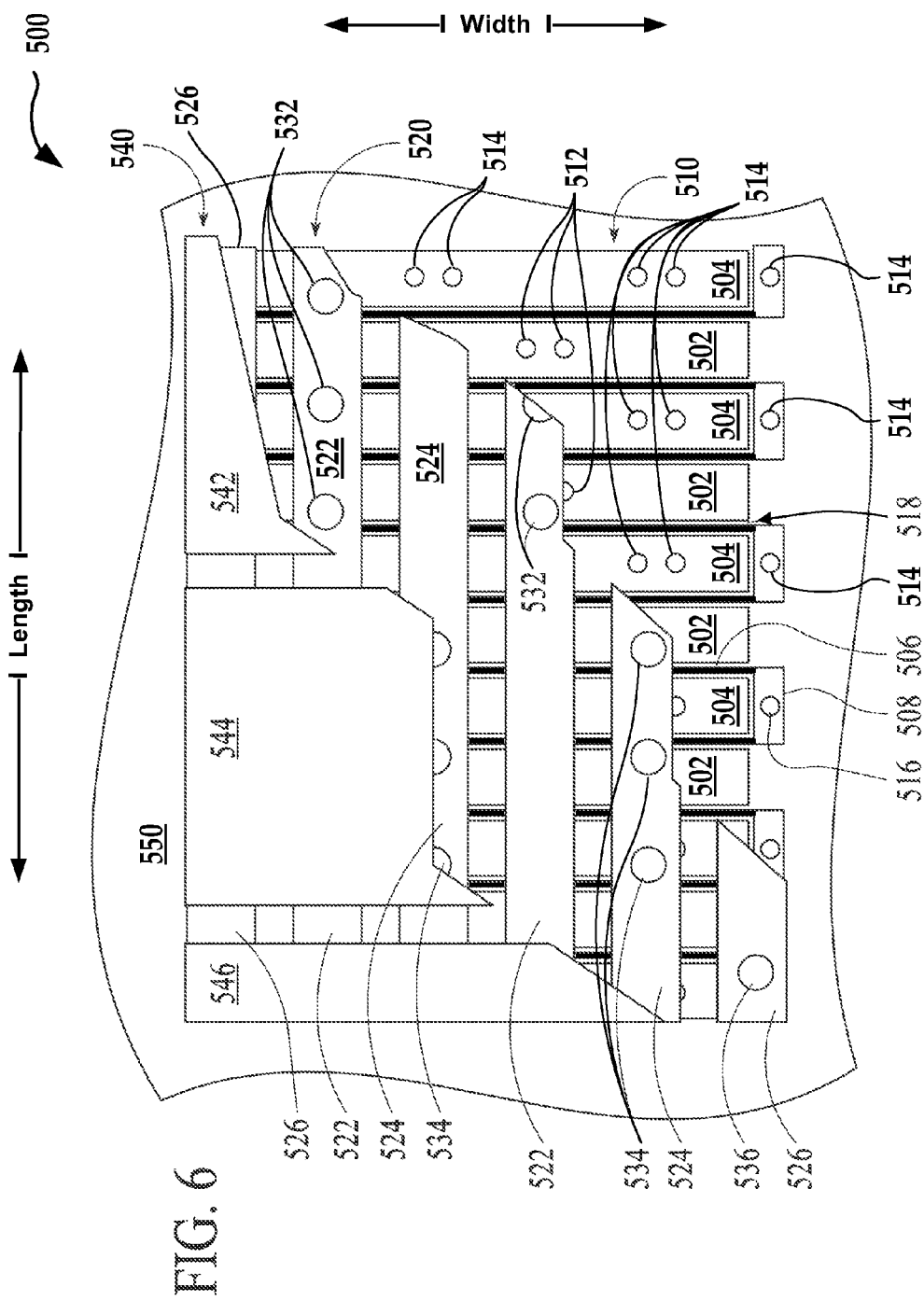
FIG. 6 is a top plan view of the cut-away of the FET device of FIG. 5A.
Figure 7:
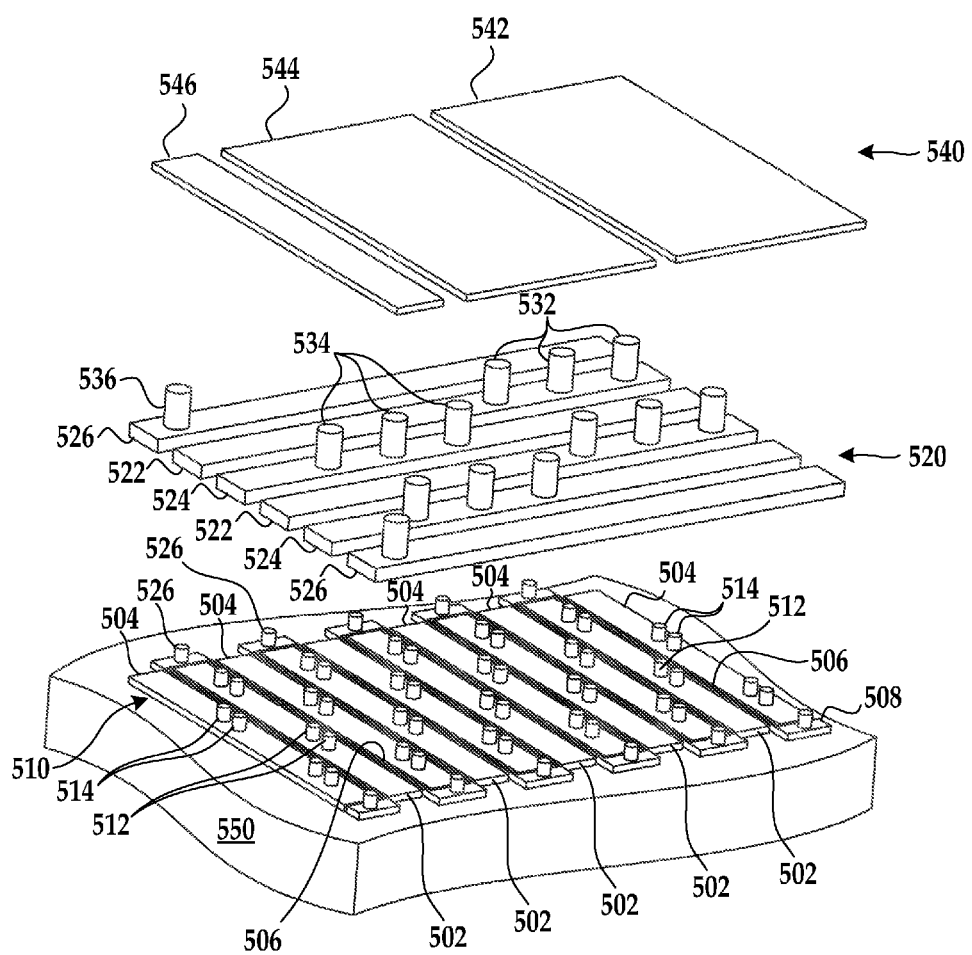
FIG. 7 is an exploded view without cutaway of the FET device of FIG. 5A.

FIG. 5A is a perspective cutaway view of a block diagram for a FET device 500 according to various aspects of the technology. FIG. 5B is a block diagram of a side elevation illustrating layers of the FET device 500 of FIG. 5A. FIG. 6 is a top plan view of the cut-away of the FET device 500 of FIG. 5A. FIG. 7 is an exploded view without cutaway of the FET device 500 of FIG. 5A. The arrangement of the components of the device 500 may provide a solution to a number of problems in scaling a compound semiconductor FET down to a smaller size. The FET device 500 includes a semiconductor layer 550 and an ohmic layer 510 disposed on the semiconductor layer 550. The semiconductor layer 550 may be a P-type or N-type semiconductor and may be fabricated using compound semiconductors such as GaAs and GaN. The semiconductor layer may be disposed on an insulating or semi-insulating substrate 560. Examples of a substrate layer include GaAs, Si-carbide, Si, and sapphire. During fabrication the substrate layer may be ground down to 50-100 microns. The FET device 500 further includes a first dielectric layer 528 disposed on the ohmic layer 510, and a first metal layer 520 disposed on the first dielectric layer 528. The FET device 500 further includes a second dielectric layer 538 disposed on the first metal layer 520 and a second metal layer 540 disposed on the second dielectric layer. The first dielectric layer 528 may cover a substantial portion or the entire surface of the FET device 500, including ohmic metal, gate metal and the exposed surface of the epitaxial layer between the gate metal and the ohmic metal. The first dielectric layer 528 may seal the covered surface and/or any embedded structures (e.g., vias) from the outside environment, protecting against accidental damage and exposure to microscopic particles. This, in turn, may eliminate the need for an external package which is often required to achieve such a level of environmental protection. Similarly, the second dielectric layer 538 may cover, seal, and/or protect the second metal layer 540. The first dielectric layer 528 and/or the second dielectric layer 538 may hermetically seal the device surface. In various embodiments, the first and second dielectric material includes silicon dioxide, silicon oxide, fluorine-doped silicon dioxide, carbon-doped silicon dioxide, porous silicon dioxide, porous carbon-doped silicon dioxide, and/or the like. The first dielectric layer 528 and second dielectric layer 538 are omitted in FIG. 5A for clarity and illustrated in FIG. 5B in block diagram form.

Figure 8:
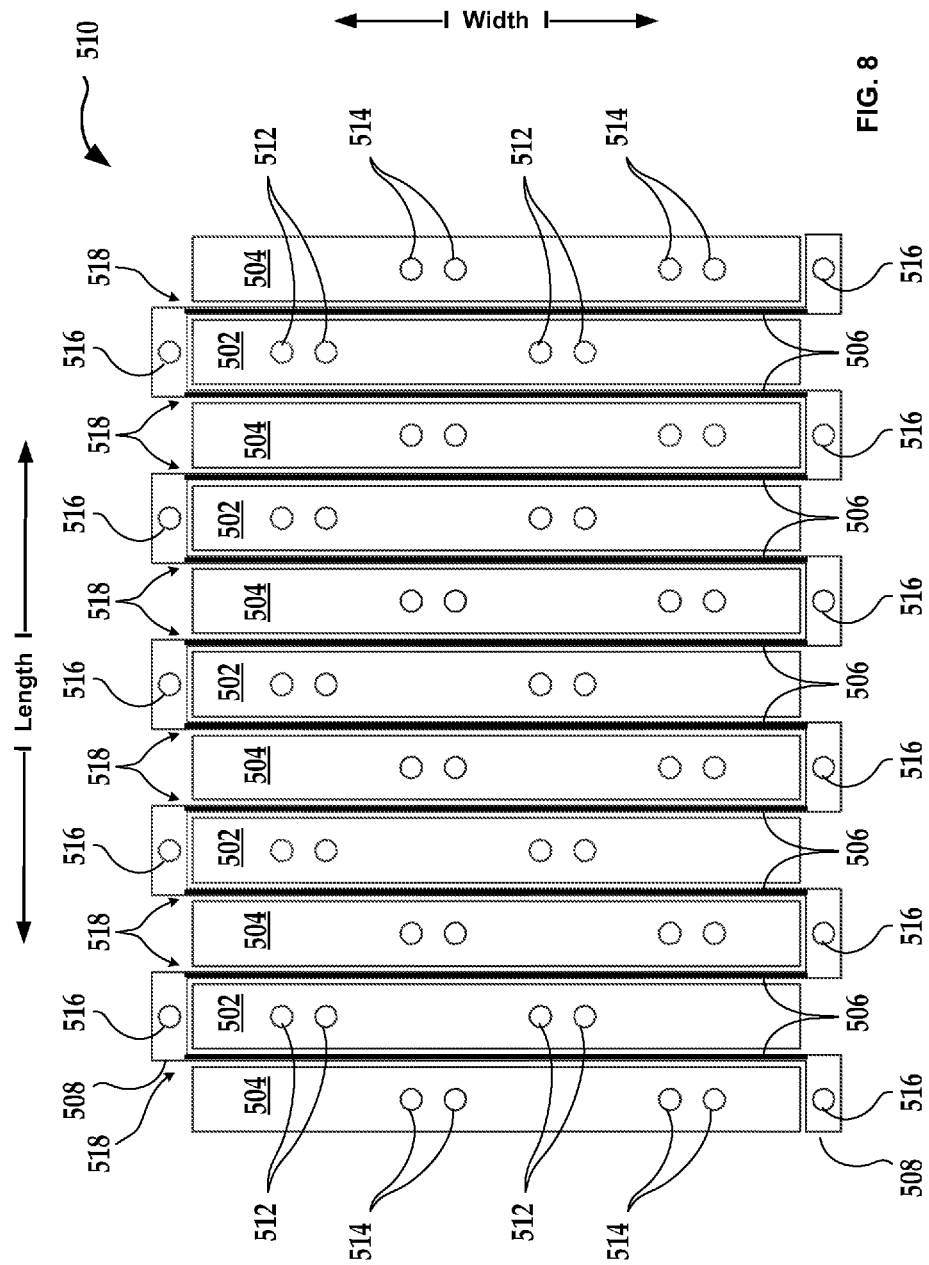
FIG. 8 illustrates details of an arrangement of the ohmic layer of FIG. 5A.

FIG. 8 illustrates details of an arrangement of the ohmic layer 510 of FIG. 5A. The ohmic layer 510 includes source fingers 502 alternating with drain fingers 504. A gate finger 506 is disposed in a gate channel 518 between each adjacent source finger 502 and drain finger 504. Ohmic metals provide low resistance contact to the semiconductor layer 550. The structure of the source fingers 502 and drain finger 504 includes ohmic metal. The source fingers 502 and drain fingers 504 may be fabricated using an alloyed metal structure forming ohmic metal deposited on a respective source finger 502 region and drain finger 504 region of doped semiconductor. In various embodiments, the alloyed metal structure includes one or more layers of Ni, Ge, Au, Cu, etc., in various alloys and combinations of layers. The wafer may be heated so that the metals alloy (or diffuse) into the epitaxial layer creating the low resistance connections. Source fingers 502 and drain fingers 504 may function interchangeably.

The gate fingers 506 comprise a set of layers of various combinations and/or alloys of deposited metals (e.g., Ti, Pt, Au, Al, Ti, and/or W). The deposited metals form a Schottky contact with the surface of the epitaxial layer, creating the Schottky diode structure in the region of epitaxial layer that comprises the gate region. The gate channel 518 may provide spacing for the gate fingers 506 between the source fingers 502 and the drain fingers 504. In various embodiments, the length of the gate channel 518 is about 0.1, 0.25, 0.5, 1, 2, 3, 4, 5, 6, 7, 8, 9, 10, or more microns. While the gate fingers 506 may not employ ohmic metals they are included as part of the ohmic layer 510.

Figure 9:
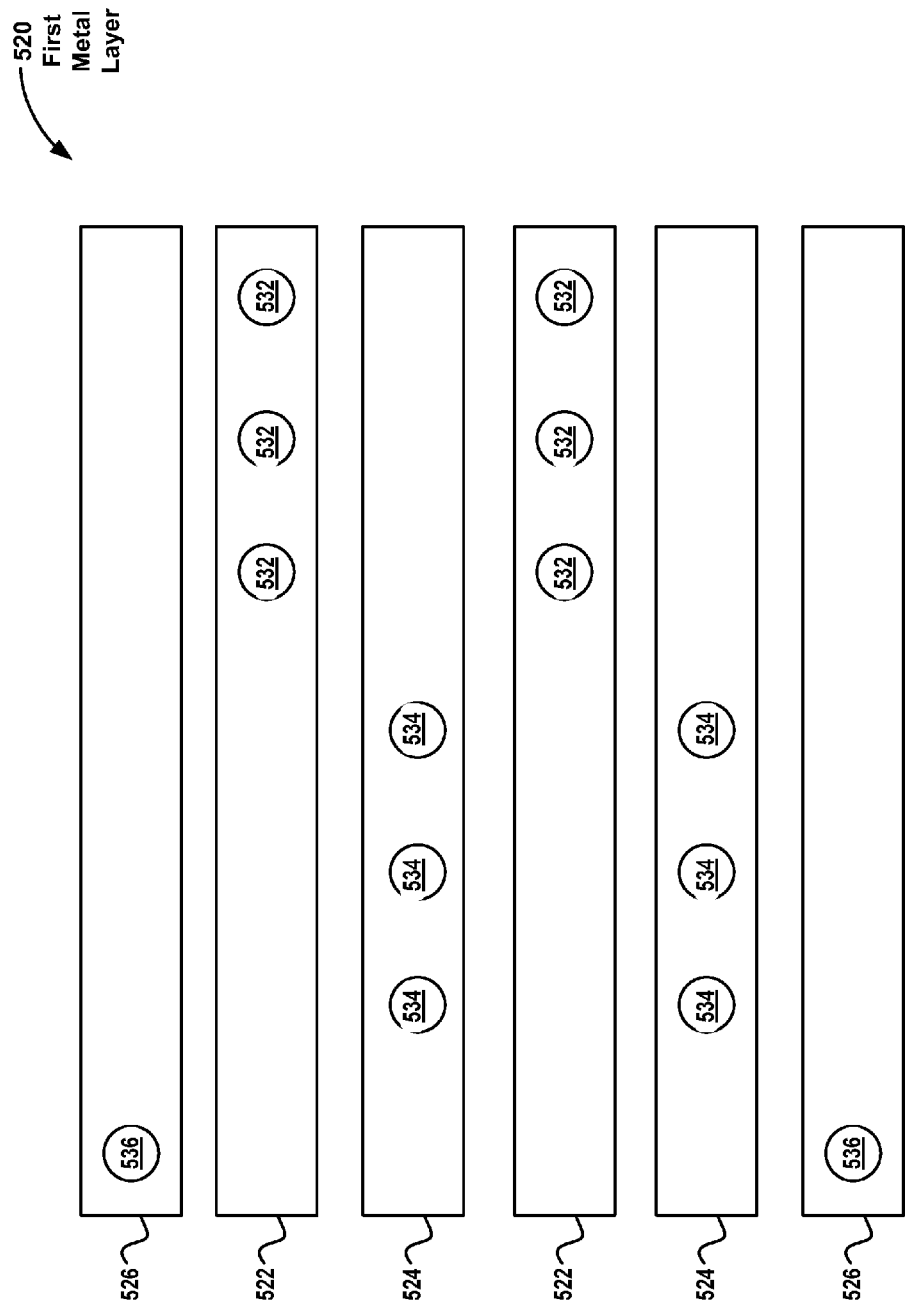
FIG. 9 illustrates details of the topology of the first metal layer of FIG. 5A.

FIG. 9 illustrates details of the topology of the first metal layer 520 of FIG. 5A. The first metal layer includes source electrodes 522, drain electrodes 524, and gate electrodes 526 which are disposed on the first dielectric layer 528. Source electrodes 522, drain electrodes 524, and gate electrodes 526 are configured to carry substantially more current without failing than the ohmic metal of the source fingers 502 and drain fingers 504. Further, source electrodes 522, drain electrodes 524, and/or gate electrodes 526 may be a very good heat conductor and configured to conduct heat substantially more efficiently than the semiconductor layer 550 and/or the insulating substrate 560.

Referring to FIG. 5A-FIG. 9, source vias 512 disposed on the source fingers are connected to source electrodes 522 and are configured to couple source current between the source fingers 502 and the source electrodes 522. Drain vias 514 disposed on the drain fingers 504 are connected to drain electrodes 524 and are configured to couple drain current between the drain fingers 504 and the drain electrodes 524. Gate vias 516 disposed on gate pads 508 are connected to gate electrodes 526 and are configured to couple a gate signal between the gate pads 508 and the gate electrodes 526. The source vias 512, drain vias 514, and gate vias 516 may be embedded in the first dielectric layer 528. The first dielectric layer 528 may cover the entire surface of the ohmic layer 510 of the FET device 500, which may have the effect of embedding the vias and sealing the ohmic metal and/or gate metal from the outside environment and may reduce a need for an external package to protect the FET device 500. In various embodiments, source vias 512, drain vias 514, gate vias 516, source electrodes 522, drain electrodes 524, and/or gate electrodes 526 are fabricated using Au, Cu, Al, W, Ag, and/or the like. In some embodiments, the source vias 512, the drain vias 514, and/or gate vias 516 are fabricated during the same step as the source electrodes 522, drain electrodes 524, and gate electrodes 526, respectively, and may be contiguous with the respective electrodes.

As can be seen in FIG. 8, each gate finger 506 receives a gate signal from gate pads 508 disposed on either end of the gate finger 506. Thus, each gate finger 506 may receive a gate signal from both ends. This is different from the standard FET structure as illustrated in FIG. 1 where the gate fingers 106 are all connected to a single large gate pad 116 disposed on one end of the gate fingers 106. The gate pads 508 of FIG. 8 are each configured to contact two gate fingers 506 in an alternating (meander or serpentine) pattern such that each end of each gate finger 506 is connected to one gate pad 508. The meander pattern in FIG. 8 may improve yield by reducing lift-off problems which are characteristic of enclosed features during fabrication. In alternative embodiments (not illustrated), each gate pad 508 may be configured to contact more than two of the ends of the gate fingers 506.

The serpentine structure for the gate fingers 506 and gate pads 508 illustrated in FIG. 8 addresses a problem contributing to low yield due to breaks in the gate fingers 506 discussed elsewhere herein. A major yield driver for typical power and/or switching FET devices is breaks in the gate fingers due to defects during fabrication. Such breaks can result, for example, from particles on the order of a micron deposited during the fabrication process. For a device that has been scaled down to increase gate periphery, such as illustrated in FIG. 4, one micron may be several gate lengths (where one gate length is typically 0.25-0.5 microns). If the gate signal were to be applied through the gate pad 116 from only one end of the gate fingers 106 illustrated in FIG. 1, any such break may leave a portion of the gate finger 106 that is beyond the discontinuity and unconnected from its voltage source (gate signal). As a result, the portion of the gate finger 106 beyond the break would be unable to control the current flowing in that section of the channel 118, thus, rendering the FET device 100 incapable of acting as a switch or power device.

However, when each gate finger 506 receives the gate signal from two independent points on either end as illustrated by the serpentine pattern in FIG. 8, such a break becomes a non-fatal flaw. The gate signal can reach all portions of the gate fingers 506 on either side of the break. A section of one of the gate fingers 506 can become unconnected, and thus, uncontrolled, only if there are two breaks in the same gate finger 506. However, the probability of two breaks in the same gate finger 506 may be a low as less than 0.04%. The impact on yield can be illustrated in the following example calculations:

Suppose a switch and/or power FET device has 250 gate fingers each 4 mm in width, representing a total gate periphery of one meter. Further suppose that the probability ($Y_0$) of any single 1-mm segment of gate finger not having a break is about 99.9%, which is a typical fabrication yield for such devices. Then the probability ($Y_f$) of there not being a break in any one entire 4-mm gate finger would be about:

$$Y_f = Y_0^4 = 99.6\%$$

Thus, the probability ($Y_t$) of no breaks in any one of the 250 gate fingers is about:

$$Y_t = Y_f^{250} = 36.8\%$$

As a result, the overall device yield for a FET device such illustrated in FIG. 1 where all the gate fingers receive a gate signal from one end only, is $Y_t$ or less than 40%.

Now consider the case where it takes two independent breaks in a single gate finger to cause the device to fail, such as illustrated in FIG. 8. The probability ($Y_d$) of having less than two breaks in a single gate finger is about:

$$Y_d = 1 - (1-Y_f)^2 = 99.998\%$$

For the overall device, the probability ($Y_{dt}$) that there are no such double breaks is about:

$$Y_{dt} = (1-[1-Y_f]^2)^{250} = 99.6\%$$

Thus, the overall device yield in the case where the gate fingers receive the gate signal independently from both ends, as illustrated in FIG. 8, is nearly 100%. In various embodiments, the length of gate fingers 506 can be 1, 0.5, 0.25, 0.15, microns or smaller. In some embodiments, the length of gate fingers 506 can be 100, 50, 25 nanometers or smaller.

The structure illustrated in FIGS. 5-9 further solves the problem of providing the source signal to the source fingers 502 without using conventional air bridge technology such as illustrated in FIG. 1. The structure illustrated in FIG. 8 also provides for high current operation without using the wide source and drain metal fingers (illustrated in FIG. 1 and FIG. 3) that are used to handle the large current densities from the air bridge contacts 112 and drain pad 114, respectively. The diameter of source vias 512, drain vias 514, and gate vias 516, may be 0.25, 0.5, 1, 2, 3, 4, 5, 6, 7, 8, 9, 10, 15, 20 microns and are typically on the order of one to three microns in diameter. Referring to FIGS. 5-9, the source vias may provide a connection between each source electrode and source finger 502 that is less than the length of the source finger. Thus, the source finger 502 may be less than 8, 7, 6, 5, 4, 3, 2, 1 or 0.5 microns in length. Multiple source vias 512 provide for distributing the source current along the source fingers 502. Current from each source via 512 may flow through a section around the source finger 502 in a region of the source via 512 and out to a point about halfway to an adjacent source via 512. Thus, separate current segments are distributed in parallel to a region around each source via 512 for reducing the current density along the source fingers 502.

Referring to FIG. 8 and FIG. 9, the source vias 512 are conductors that are distributed along the width of the source fingers 502 to distribute source current. Source current may be partitioned into a plurality of source current segments for distribution through the source vias 512 along the width of a source finger 502. Each source via 512 may conduct a segment of the partitioned source current to a section of the source finger 502 proximate the respective source via 512. Each of the source electrodes 522 may distribute a segment of the source current to a section of a source finger 502. Each source electrode 522 may be in electrical contact with at least one of a plurality of the source vias 512 along a width of a source finger 502. The source electrodes 522 may be disposed on the first dielectric layer 528 along the width of the source fingers 502. As illustrated in FIG. 5A, the source electrodes 522 may be oriented to cross the source fingers 502 at about right angles. Each source electrode 522 may be electrically coupled through at least one of the source vias 512 embedded in the dielectric layer to a section of each of one or more source fingers 502. In various embodiments, a pitch of the source electrodes 522 along the width of the source fingers 502 is less than about 60, 50, 40, 30, 20, 10, 5, 1, 0.5, or 0.25 microns.

Similarly, multiple drain vias 514 provide for distributing the drain current along the drain fingers 504, thus, reducing the current density in the drain fingers 504. The drain vias 514 are conductors that are distributed along the width of the drain fingers 504 to distribute drain current. Drain current may be partitioned into a plurality of drain current segments for distribution through the drain vias 514 along the width of a drain finger 504. Each drain via 514 may conduct a segment of the partitioned drain current to a section of the drain finger 504 proximate the respective drain via 514. Each of the drain electrodes 524 may distribute a segment of the drain current to a section of a drain finger 504. Each drain electrode 524 may be in electrical contact with at least one of a plurality of the drain vias 514 along a width of a drain finger 504. The drain electrodes 524 may be disposed on the first dielectric layer 528 along the width of the drain fingers 504. As illustrated in FIG. 5A, the drain electrodes 524 may be oriented to cross the drain fingers 504 at about right angles. Each drain electrode 524 may be electrically coupled through at least one of the drain vias 514 embedded in the dielectric layer to a section of each of one or more drain fingers 504. In various embodiments, a pitch of the drain electrodes 524 along the width of the drain fingers 504 is less than about 60, 50, 40, 30, 20, 10, 5, 1, 0.5, or 0.25 microns.

The gate periphery (the product of the number of gate fingers times the average width of each gate finger) may be driven by the sizes of the source fingers 102, the drain fingers 104, the channels 118, and the gate fingers 106. Smaller lengths may reduce the size of a device and larger widths of these features may increase the gate periphery. In various embodiments, the gate periphery of the FET device 500 is about 200, 300, 400, 500, 600, 700, 800, 900, 1,000, 1,500, 2,000 or more microns.

Figure 10:
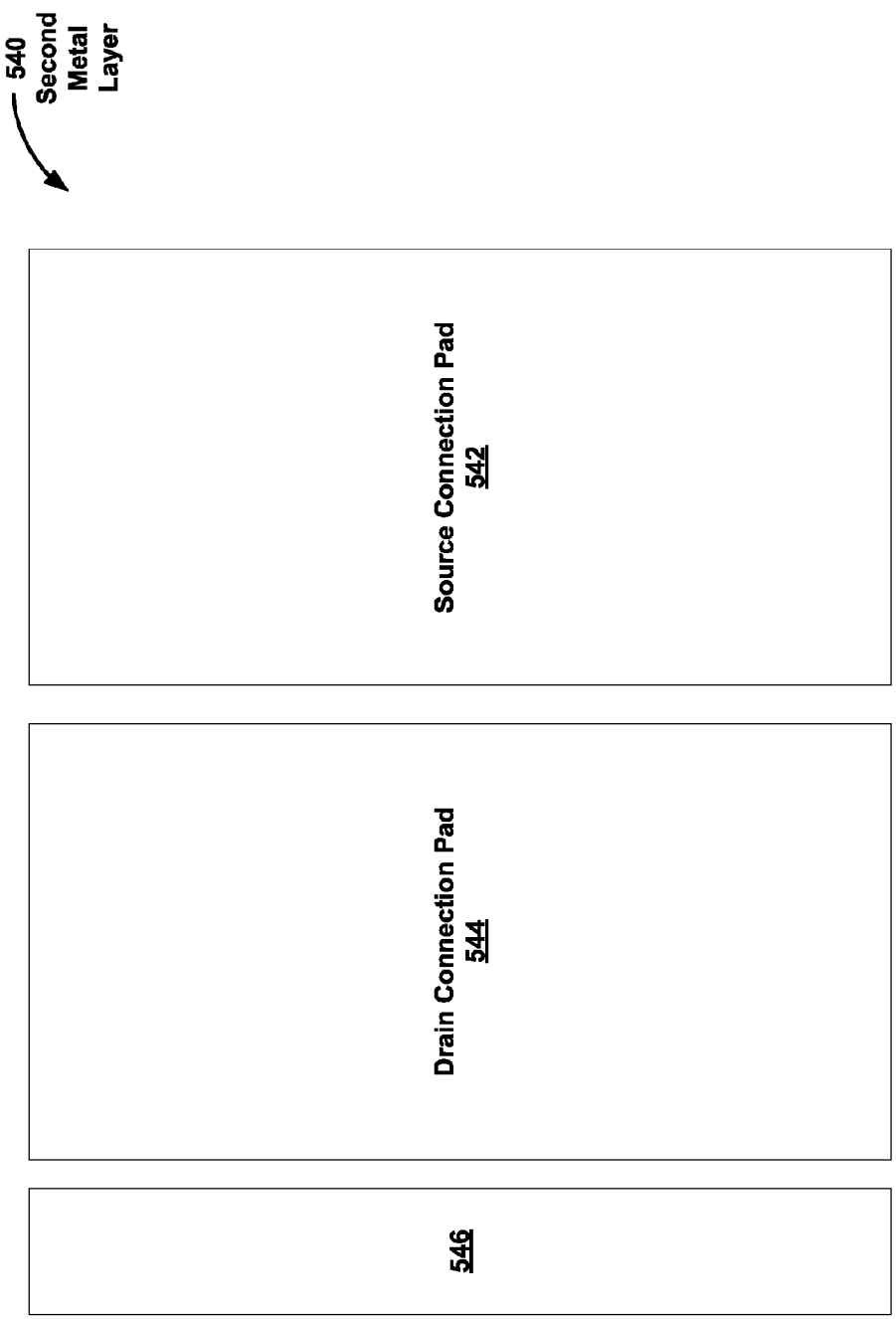
FIG. 10 illustrates details of a second metal layer of FIG. 5A.

FIG. 10 illustrates details of a second metal layer 540 of FIG. 5A. The second metal layer includes a source connection pad 542, a drain connection pad 544 and a gate connection pad 546. The source connection pad 542 is configured to provide connection for source current between the FET device 500 and a circuit board and/or another device. The drain connection pad 544 is configured to provide connection for drain current between the FET device 500 and a circuit board and/or another device. The gate connection pad 546 is configured to provide connection for gate signals from the FET device 500 to a circuit board and/or another device. In some embodiments, the circuit board may carry the source current, drain current, and/or gate signal to other devices, e.g., in a converter circuit. The source connection pad 542, drain connection pad 544 and/or gate connection pad 546 may be connected directly to other devices.

Referring to FIG. 9 and FIG. 10, metal vias are disposed between the first metal layer 520 and second metal layer 540. The metal vias may be embedded in the second dielectric material. The metal vias, include source vias 532, drain vias 534, and gate vias 536. The source vias 532 are configured to connect the source electrodes 522 to the source connection pad 542. The drain vias 534 are configured to connect the drain electrodes 524 to the drain connection pad 544. The gate vias 536 are configured to connect the gate electrodes 526 to the gate connection pad 546.

When a wafer is singulated into individual FET devices, the source connection pad 542, drain connection pad 544, and gate connection pad 546 enable the die to be bonded onto a carrier substrate or package using standard bumping and surface mount technologies. Note that because of the bilateral nature of the FET structure itself, current can flow through the switch or power device in either direction and the source and drain elements and contacts are effectively interchangeable.

While FIGS. 5-10 illustrate a device including components comprising five source fingers 502, six drain fingers 504, ten gate fingers 506, two source electrodes 522, two drain electrodes 524, two gate electrodes 526, one source connection pad 542, one drain connection pad 544, and one gate connection pad 546, more or fewer of each may be used for fabrication of the device of FIGS. 5-10. Also, more or fewer source vias 512, source vias 532, drain vias 514, drain vias 534, gate vias 516, and/or gate vias 536 may be used to for fabrication of the FET device 500. FIGS. 1-13 are not to scale.

Figure 11:
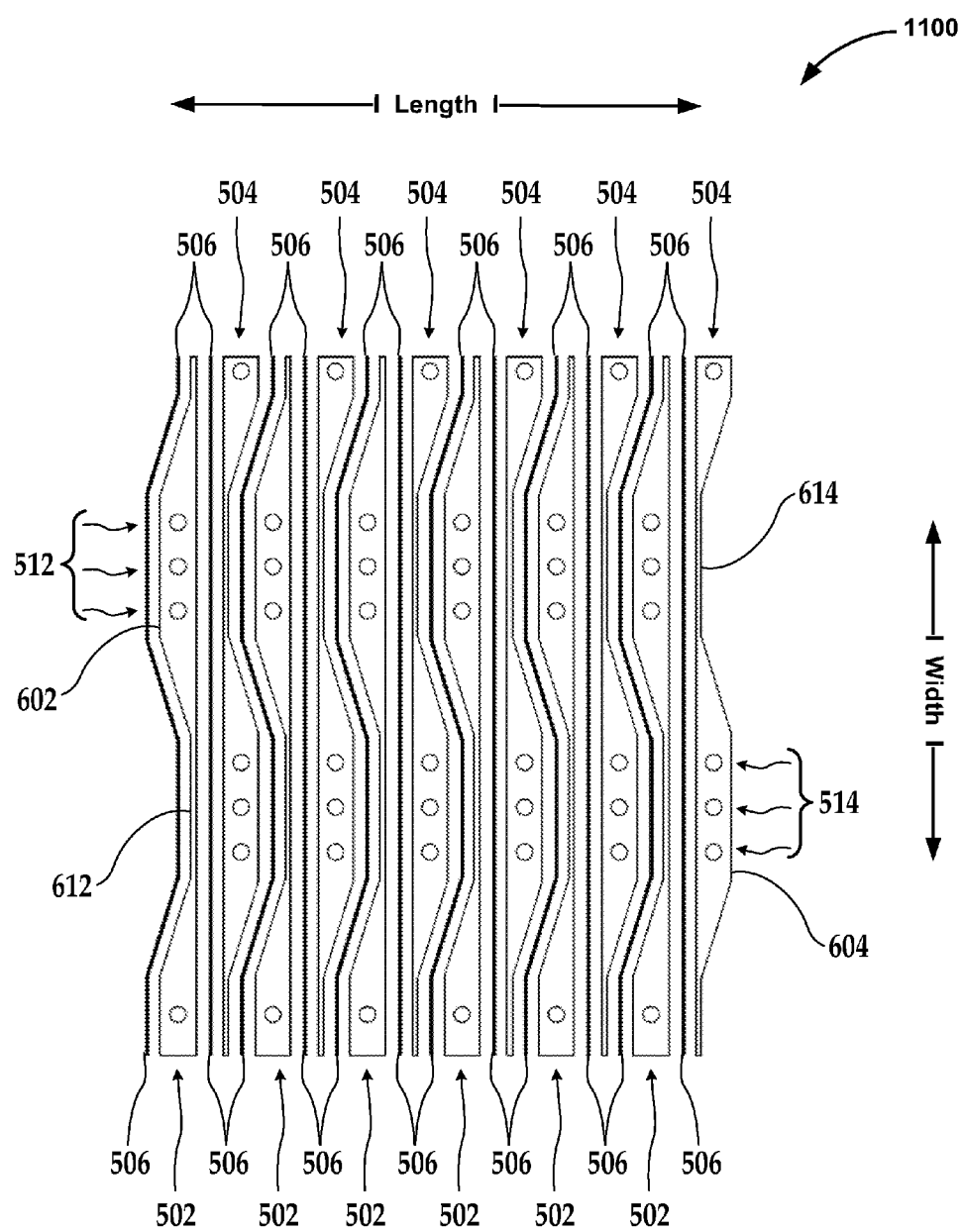
FIG. 11 illustrates an alternative embodiment of the layout illustrated in FIG. 8, in accordance with various aspects of the invention.
Figure 12:
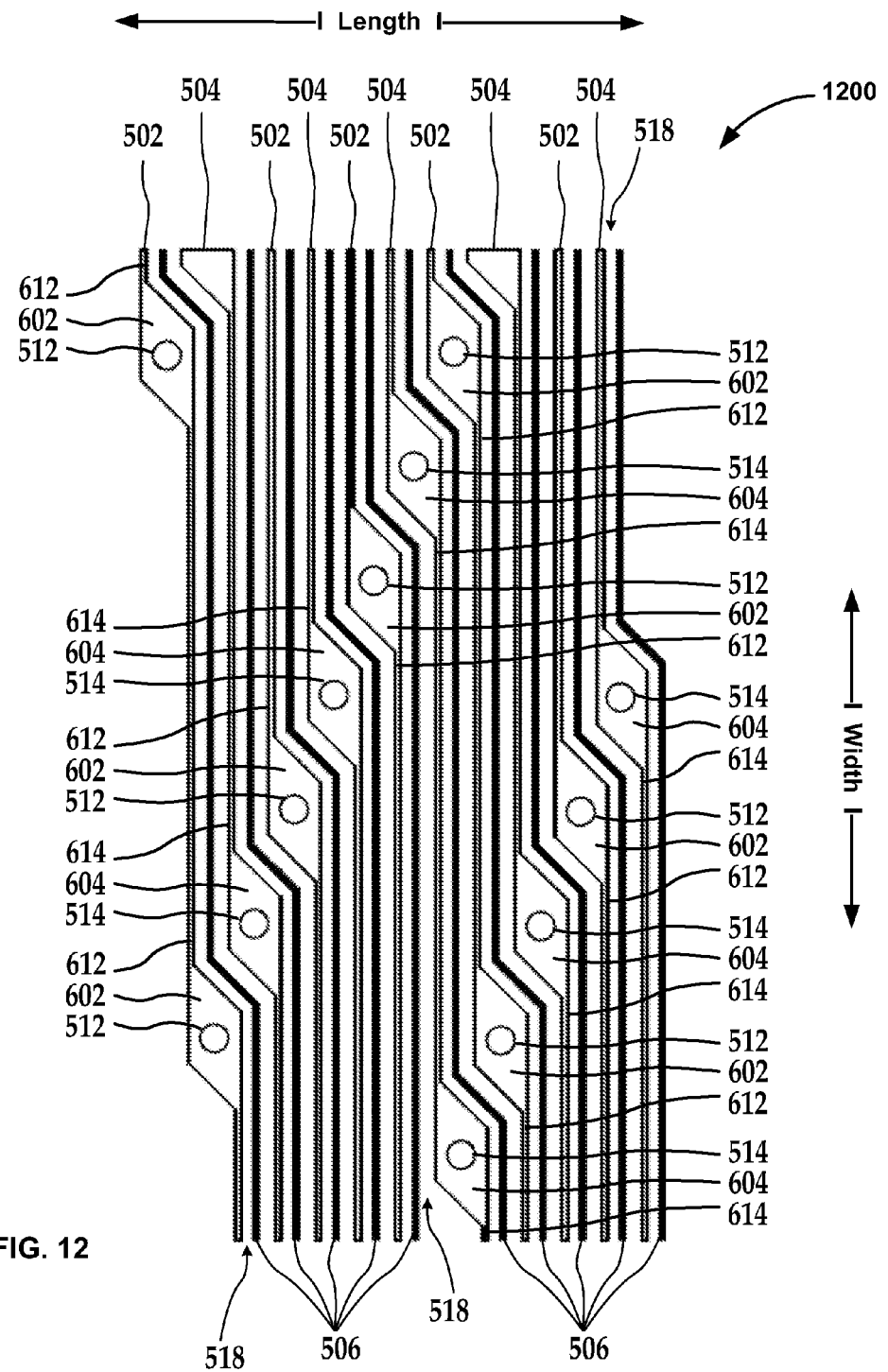
FIG. 12 illustrates an alternative embodiment of the layout illustrated in FIG. 8, in accordance with various aspects of the invention.
Figure 13:
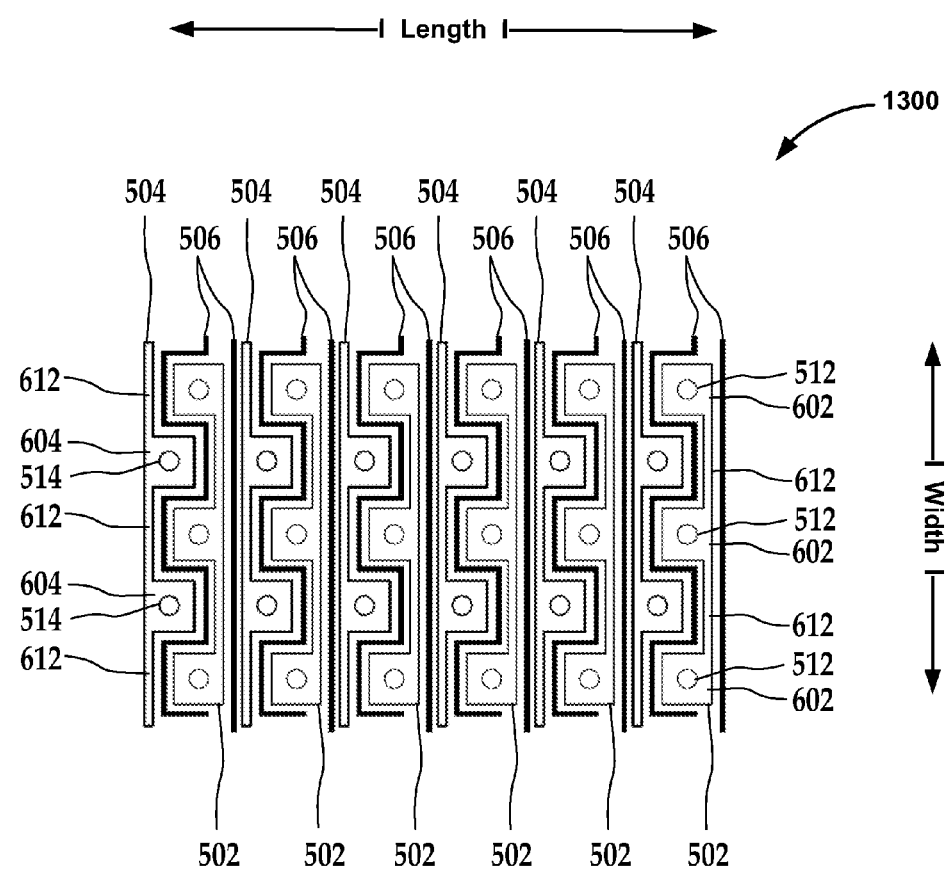
FIG. 13 illustrates an alternative embodiment of the layout illustrated in FIG. 8, in accordance with various aspects of the invention.

FIGS. 11-13 illustrate alternative embodiments of the layout illustrated in FIG. 8, in accordance with various aspects of the technology. The gate pads 508 are omitted for simplicity. In FIGS. 11-13, source fingers 502 include source pads 602 and source lines 612. Similarly, drain fingers 504 include drain pads 604 and drain lines 614. The pads may be larger than the lines to accommodate vias. The source pads 602 are locations for source vias 512 distributed along the width of the source fingers. Similarly, the drain pads are locations for drain vias 514 distributed along the width of the drain pads. The sizes of the source pads 602 and drain pads 604 may be configured to support the source vias 512 and drain vias 514, respectively. Thus, the length of the source fingers 502 and the drain fingers 504 may be decreased and may be smaller than the length of the source pads 602 and drain pads 604, respectively. The source pads 602 and the drain pads 604 are distributed along the width of the source fingers 502 and drain fingers 504, respectively.

The layout 1100 of FIG. 11 illustrates an alternative embodiment of the layout of the ohmic layer 510 illustrated in FIG. 5A and in more detail in FIG. 8, in accordance with various aspects of the invention. FIG. 11 shows source line 612 and drain line 614 having a length as small as 0.25-1.5 micron. Such length may be adequate for most switch applications provided the distance along the width axis which current must travel on the source line 612 and drain line 614 is short enough that the contribution to the total resistance of the source finger 502 and drain finger 504 is small. The source lines 612 may alternate with source pads 602 to reduce current density in each source line 612. Similarly, the drain lines 614 may alternate with drain pads 604 to reduce current density in each drain line 614. The positions of the source pads 602 may be offset relative to drain pads 604. Thus, the overall surface area required to accommodate a given amount of gate periphery can be further reduced. For example, the structure shown in FIG. 11 may be 33% more area efficient than the layout illustrated in FIG. 8.

The layout 1200 of FIG. 12 illustrates an alternative embodiment of the layout of the ohmic layer 510 illustrated in FIG. 5A and in more detail in FIG. 8, in accordance with various aspects of the invention. The layout 1300 of FIG. 13 illustrates an alternative embodiment of the layout of the ohmic layer 510 illustrated in FIG. 5A and in more detail in FIG. 8, in accordance with various aspects of the invention. The layout of FIG. 12 may be used for applications that involve switching or controlling relatively low currents. Referring to FIGS. 12 and 13, the source pads 602 and drain pads 604 may be configured for supporting vias 512 and 514, respectively. The source lines 612 are disposed between adjacent source pads 602. The drain lines 614 are disposed between adjacent drain pads 604. The source pads 602 and drain pads 604 may be further separated and their size reduced by reducing the number of vias 512 and 514, respectively, to as few as one, as illustrated in FIG. 12. Thus, the area used to support a given amount of gate periphery may be further compacted. The example shown in the FIG. 12 may have a ratio of gate periphery to overall surface area of about 0.143 $\mu m/\mu m^2$. As the separation between source pads 602 and/or drain pads 604 becomes greater, the ratio of gate periphery to overall surface area may asymptotically approach about 0.167, for example where the source fingers 502 and drain fingers 504 have a length of about one micron and the gate channel 518 has a length of about five microns.

While the layouts illustrated in FIGS. 11-13 illustrate alternative embodiments of the layout of the ohmic layer 510 additional alternative layouts employing the similar general design principles are also possible. In various embodiments illustrated in FIGS. 11-13, the source pads 602 may be separated by source lines 612 of about 1, 2, 3, 4, 5, 10, 15, 20, 30, 40, 50 microns or more in width. Similarly, the drain pads 604 may be separated by drain lines 614 of about 1, 2, 3, 4, 5, 10, 15, 20, 30, 40, 50 microns or more in width. In various embodiments illustrated in FIGS. 11-13, each source pad 602 and/or drain pad may include 1, 2, 3, 4, 5, 10 or more vias.

Table 1 illustrates an exemplary comparison of various parameters for a layout for a prior art power FET as illustrated in FIG. 1, and embodiments of compound semiconductor FET devices such as illustrated in FIGS. 5A, 11, 12, and 13. The column labeled "Gate Periphery" represents total gate periphery in microns that are within an exemplary unit cell, which may be determined as the product of the number of gates and the width of the gates. The column labeled "Length" and "Width" represent the length and width, respectively, in microns of the unit cell. The column labeled "Ratio" represents the ratio of the total gate periphery to the area of the unit cell (Length×Width). The units for the ratio of the total gate periphery to the unit cell area are microns and square microns, respectively. The areas in the column labeled "Die Area" represents calculated area in square millimeters for a device having a total gate periphery of about 1 meter (1,000 millimeters). The column labeled "Gross Die/Wafer" represents an estimate of the number of die that may be fabricated on a wafer that has either a 4 inch diameter (4" column) or a 6 inch diameter (6" column).

TABLE 1

| | Unit Cell | | | Die | Gross | |
| | Gate | | | Ratio | Area | Die/Wafer | |
| | Periphery | Length | Width | $\mu m/\mu m^2$ | $(mm^2)$ | 4" | 6" |
|---|---|---|---|---|---|---|---|
| Prior Art Power FET (FIG. 1) | 200 | 70 | 100 | 0.029 | 35 | 224 | 504 |
| FET illustrated in FIG. 5A | 600 | 72 | 100 | 0.083 | 12 | 638 | 1,436 |
| FET illustrated in FIG. 11 | 800 | 72 | 100 | 0.111 | 9 | 844 | 1,898 |
| FET illustrated in FIG. 12 | 600 | 42 | 100 | 0.143 | 7 | 1,075 | 2,420 |
| FET illustrated in FIG. 13 | 248 | 36 | 48 | 0.144 | 7 | 1,180 | 2,530 |

FIG. 14 illustrates a typical circuit diagram 1400 for a buck converter. In the buck converter circuit 1400 there are two switch devices known as the control (or high side) FET 1408 and the sync (or low side) FET 1418. As can be seen in the diagram, the control FET's source terminal 1406 to connected directly to the sync FET's drain terminal 1412. A node 1410 between the two devices is also connected to the converter's output through an inductor 1420 of an LC network. Note that in this diagram the devices are shown as MOSFETs where the switch control is connected to the back side of the device and the front side gate terminal is connected directly to the source. For a compound semiconductor FET device the switch control is the front side gate and there is no need to have a bias on the back side of the die.

FIG. 15 illustrates an elevation view of a prior art implementation of a device 1500 for the buck converter circuit 1400 of FIG. 14. The device 1500 uses conventional silicon MOSFET devices. The relative sizes of the components of FIG. 15 are not shown to scale. In FIG. 15, the control FET 1408 and sync FET 1418 are illustrated as fabricated using separate die disposed on a substrate 1510, such as a printed circuit board. The control FET 1408 includes a drain 1502 and a source 1506. The sync FET 1418 includes a drain 1512 and a source 1516. FIG. 15 illustrates a flow of current through the control FET 1408 and the sync FET 1418. Flow of current A-H may be represented by the bold arrows including arrows labeled "Current A" through "Current H." Current may be seen to flow through the control FET 1408 beginning at a copper strap 1508 that extends from the metal pad on the circuit board to the top of the MOSFET die. The current flows from the copper strap 1508 through the drain 1502 (Current C) to the source 1506 (top to bottom) when a gate (not illustrated) controlled by the lead 1404 switches the FET to its ON state. This then means that the bottom of the die of the control FET 1408 must be electrically connected to the top of the die of the sync FET 1418 via a lead 1522 for Currents D and E to reach a copper strap 1518. Current F flows through a copper strap 1518, which is connected to the inductor 1420 that, in turn, is connected to the converter output.

Moreover, during each cycle, the states of the control FET 1408 and the sync FET 1418 may switch so that the control FET 1408 is in the OFF state and the sync FET 1418 is in the ON state. When the sync FET is in the ON state, current flows from the inductor 1420 back up copper strap 1410 to the sync FET drain electrode 1518. This flow of current may be represented as a reverse of Current G. From the sync FET drain electrode 1518, current flows through the sync FET 1418 (Current H) to sync FET source 1516 which is connected to electrical ground.

In addition, since heat is generated in the bulk of the device, a heat sink (not illustrated) is normally applied to both the top and bottom surfaces of control FET 1408 and sync FET 1418 to minimize the temperature rise. These requirements lead to a relatively complex packaging problem as shown in FIG. 15. Parasitic capacitance and inductance may result from the connections from the control FET source 1506 to the copper strap 1518 and through the copper strap 1518 to the inductor 1420 during one part of the converter cycle, and from the inductor 1420 back through the copper strap 1518 to the sync FET drain 1512 for the other part of the converter cycle. Such parasitic capacitances and inductances may result in a decrease in switching speed of the device 1500.

A compound semiconductor FET switch fabric architecture as illustrated in FIGS. 4-13 may be adapted to eliminate this complicated packaging problem. This may be made possible by fabricating both the control and sync switch devices on the same die, which further makes it possible to integrate critical connections between the control FET and sync FET into the device layout.

Figure 16:
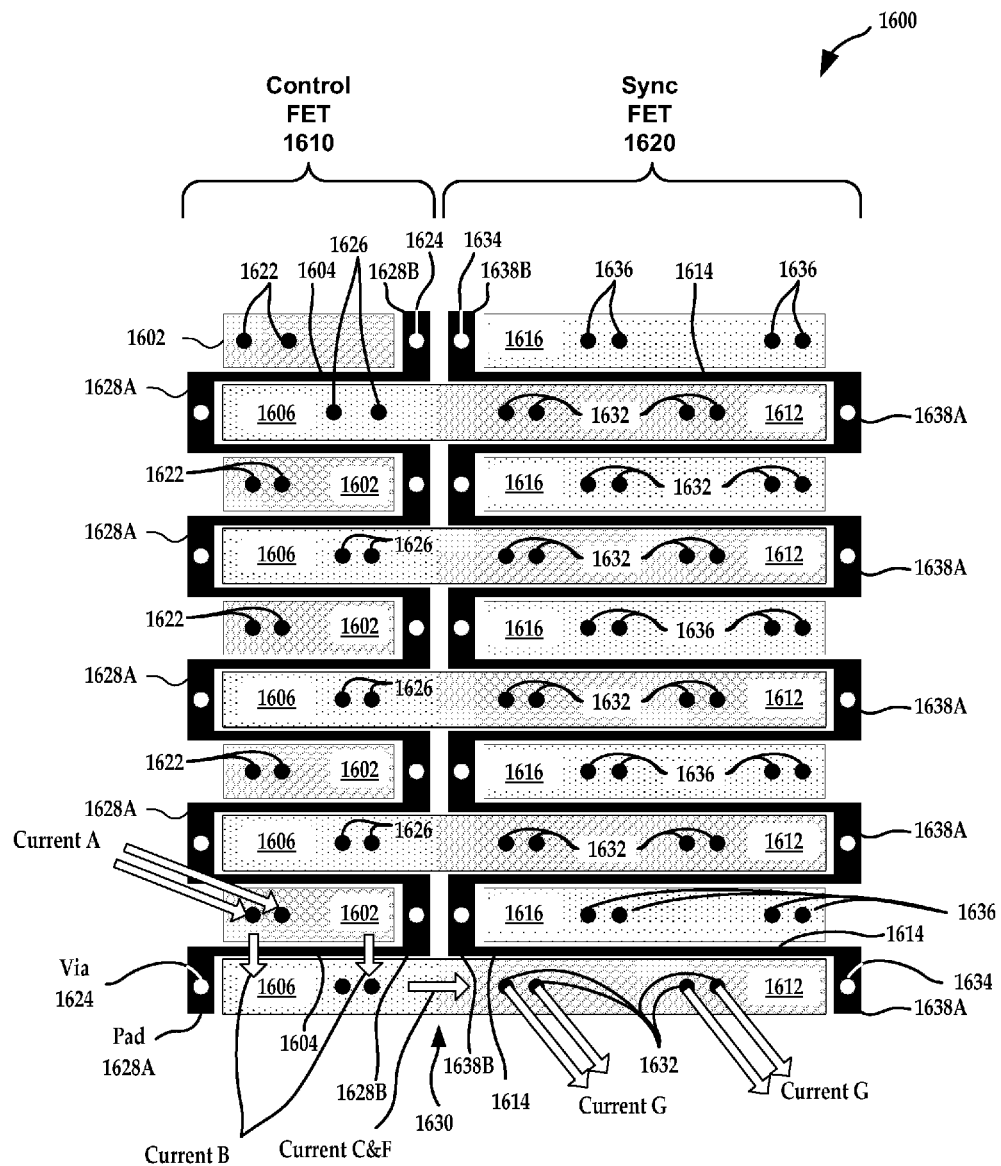
FIG. 16 illustrates details of an alternate embodiment of a layout of an ohmic and gate metal layers of FIG. 5A for implementing the circuit of FIG. 14 in accordance with embodiments of the invention.

FIG. 16 illustrates details of a layout of an ohmic layer 1600 of FIG. 5A for implementing the circuit 1400 of FIG. 14 in accordance with embodiments of the invention. The layout of the ohmic layer 1600 of FIG. 16 differs from the layout of FIG. 8 in that there are two compound semiconductor devices including the control FET 1610 and the sync FET 1620 that are integrated onto a single ohmic layer 1600. The control FET 1610 of the ohmic layer 1600 includes source fingers 1606 alternating with drain fingers 1602. A serpentine gate finger 1604 is disposed in a gate channel between each adjacent source finger 1606 and drain finger 1602.

Similarly, the sync FET 1620 of the ohmic layer 1600 includes source fingers 1616 alternating with drain fingers 1612. A serpentine gate finger 1614 is disposed in a gate channel between each adjacent source finger 1616 and drain finger 1612 of the sync FET 1620. As in FIG. 5A, ohmic metals provide low resistance contact to the compound semiconductor material of the ohmic layer 1600. The structure of the source fingers 1606 and 1616, and the drain fingers 1602 and 1612 includes ohmic metal. The source fingers and drain fingers may be fabricated using an alloyed metal structure forming ohmic metal deposited on a respective source finger 1606 and 1616 region and drain finger 1602 and 1612 region of doped semiconductor. The wafer may be heated so that the metals alloy (or diffuse) into the epitaxial layer creating the low resistance connections.

The gate fingers 1604 and 1614 may be formed as a Schottky contact as described with respect to FIG. 5A. The gate channel may provide spacing for the gate fingers 1604 and 1614 between respective the source fingers and the drain fingers. While the gate fingers 1604 and 1614 may not employ ohmic metals they are included as part of the ohmic layer 1600.

FIG. 16 further differs from FIG. 5A in that each of the source fingers 1606 in the control FET 1610 is directly connected to one of the drain fingers 1612 in the sync FET at a node 1630. As discussed elsewhere herein, the symmetrical nature of the ohmic metal structure of a FET results in the source and drain fingers being interchangeable. Thus, the direct connection between the ohmic metal of each source finger 1606 and drain finger 1612 creates a continuous ohmic metal structure comprising both the source finger 1606 and drain finger 1612. The continuous ohmic metal structure forms an integral and distributed connection between the two devices at node 1630. This may be thought of as the node 1410 in the buck converter circuit 1400 of FIG. 14.

Further, the serpentine pattern of the gates 1604 includes dual pads 1628 similar to the pads 508 of FIG. 8. Likewise, the serpentine pattern of the gates 1614 includes dual pads 1638 similar to the pads 508 of FIG. 8. The second set of gate pads 1638 of the dual set of gate pads and the small separation in between the control FET 1610 and sync FET 1620 provide only an incremental area increase for the switch fabric of a device using the layout of the ohmic layer 1600 (comprising devices 1610 and 1620), as compared to the area of the two switch devices if they were fabricated separately. Thus, the manufacturing cost for the switch fabric of the device using ohmic layer 1600 is only marginally greater than the manufacturing cost of making the two switches separately and offset by the cost of connecting and mounting two separate devices as illustrated in FIG. 15.

The control FET 1610 of the layout of the ohmic layer 1600 further includes drain vias 1622 disposed on the drain fingers 1602. These are similar to drain vias 514 of FIG. 8. The control FET 1610 further includes source vias 1626, which are disposed on source fingers 1606. These are similar to source vias 502 of FIG. 8. Gate vias 1624 are disposed on the dual gate pads 1628A and 1628B of the control FET 1610. These are similar to gate vias 516 of FIG. 8.

The sync FET 1620 of the layout of the ohmic layer 1600 includes drain vias 1632 disposed on the drain fingers 1612 and source vias 1636 disposed on the source fingers 1616. These are similar to drain vias 514 and source vias 512, respectively, of FIG. 8. Gate vias 1634 are disposed on the dual gate pads 1638A and 1638B of the sync FET 1620. These are similar to gate vias 516 of FIG. 8.

Figure 17:
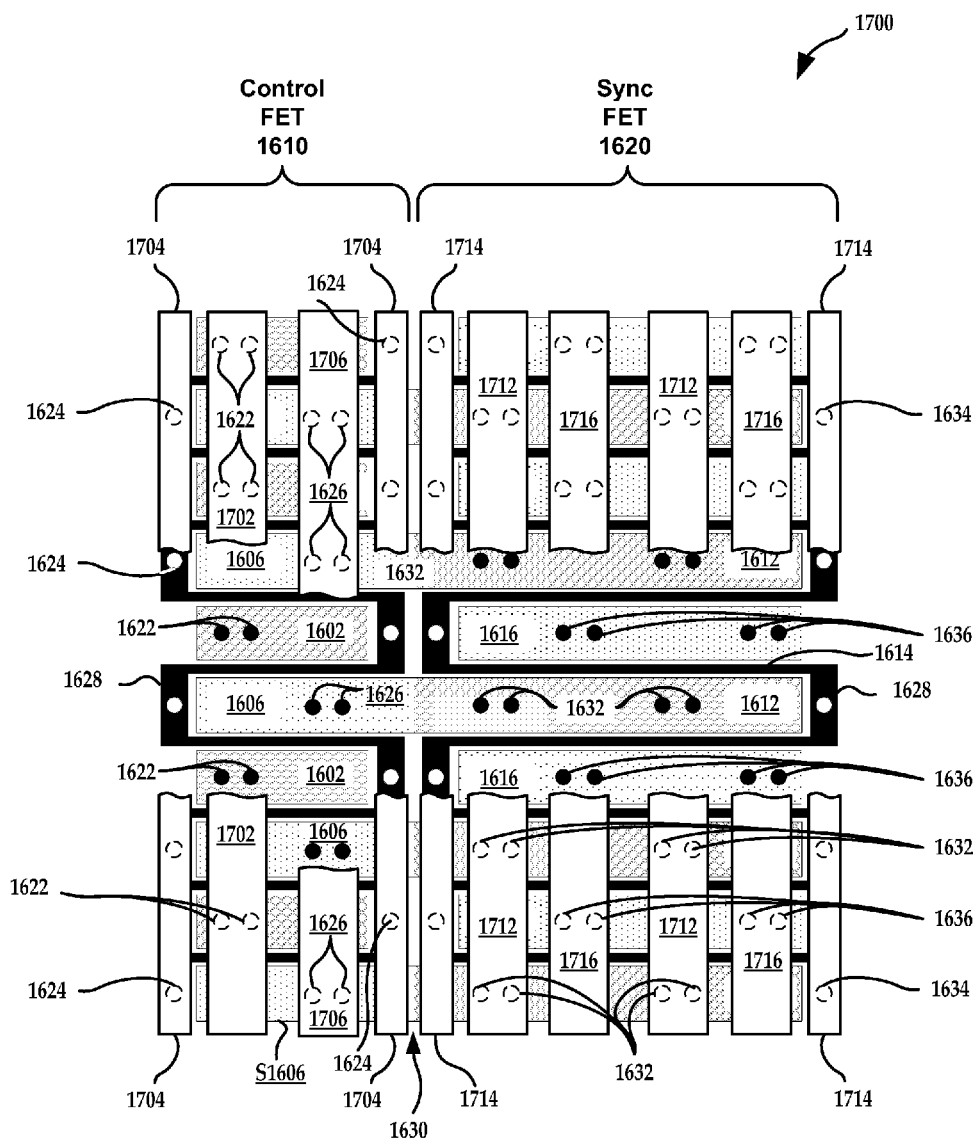
FIG. 17 is a breakaway view illustrating details of a topology of a first metal layer in relation to the ohmic layer of FIG. 16.

FIG. 17 is a breakaway view illustrating details of a topology of an alternate embodiment of a first metal layer 1700 in relation to the ohmic layer 1600. Portions of the first metal layer 1700 are illustrated as broken away to reveal underlying structures of the ohmic layer 1600. The first metal layer 1700 may be separated from the ohmic layer 1600 using a first dielectric layer 528. The first metal layer 1700 of FIG. 17 differs from the first metal layer 520 of FIG. 5B and FIG. 9 in that the first metal layer 1700 includes source electrodes, gate electrodes and drain electrodes for two compound semiconductor FET devices, i.e., control FET 1610 and sync FET 1620. The first metal layer 1700 includes source electrodes 1706 for the control FET and source electrodes 1716 for the sync FET. These electrodes are similar to source electrodes 522 of FIG. 5A. Source electrodes 1706 may be connected to source fingers 1606 through source vias 1626. Source electrodes 1716 may be connected to source fingers 1616 through source vias 1636.

The first metal layer 1700 further includes drain electrodes 1702 and 1712 for control FET 1610 and sync FET 1620, respectively, similar to drain electrodes 524 of FIG. 5A. The drain electrodes 1702 may be connected to drain fingers 1602 through vias 1622, and the drain electrodes 1712 may be connected to drain fingers 1612 through drain vias 1632.

The first metal layer 1700 also includes dual gate electrodes 1704 and dual gate electrodes 1714 for control FET 1610 and sync FET 1620, respectively, similar to gate electrodes 526 of FIG. 5A. The dual gate electrodes 1704 may be connected to dual gate pads 1628 through vias 1624, and the dual gate electrodes 1714 may be connected to dual gate pads 1638 through vias 1634.

The drain electrodes 1702, the source electrodes 1706, and dual gate electrodes 1704 are electrodes for the control FET 1610. The drain electrodes 1712, source electrodes 1716 and dual gate electrodes 1714 are electrodes for the sync FET 1620. Depending on parasitic resistance, drain electrodes may be omitted for the control FET 1610 because of the direct connection between source finger 1606 and corresponding drain finger 1612 at node 1630. Source electrodes 1716, drain electrodes 1702, drain electrodes 1712, source electrodes 1706, gate electrodes 1704, and gate electrodes 1714 are continuous but are illustrated broken across the center for clarity to reveal portions of the layout of the ohmic layer 1600. While only one drain electrode 1702 and one source electrode 1706 are illustrated in FIG. 17, the control FET 1610 may include a plurality of drain and source electrodes and respective vias distributed along the width of the drain finger 1602 and source finger 1606. Vias 1622, 1624, 1626, 1632, 1634, 1636 extend through the first dielectric layer 528 to connect the ohmic layer 1600 to the first metal layer 1700. While one drain electrode 1702 and one source electrode 1706 are illustrated in FIG. 17, more source electrodes 1706 and/or drain electrodes 1702 may be disposed in embodiments of the first metal layer 1700. While two drain electrodes 1712 and two source electrodes 1716 are illustrated in FIG. 17, more or fewer drain electrodes 1712 and/or source electrodes 1716 may be disposed in embodiments of the first metal layer 1700.

Figure 18:
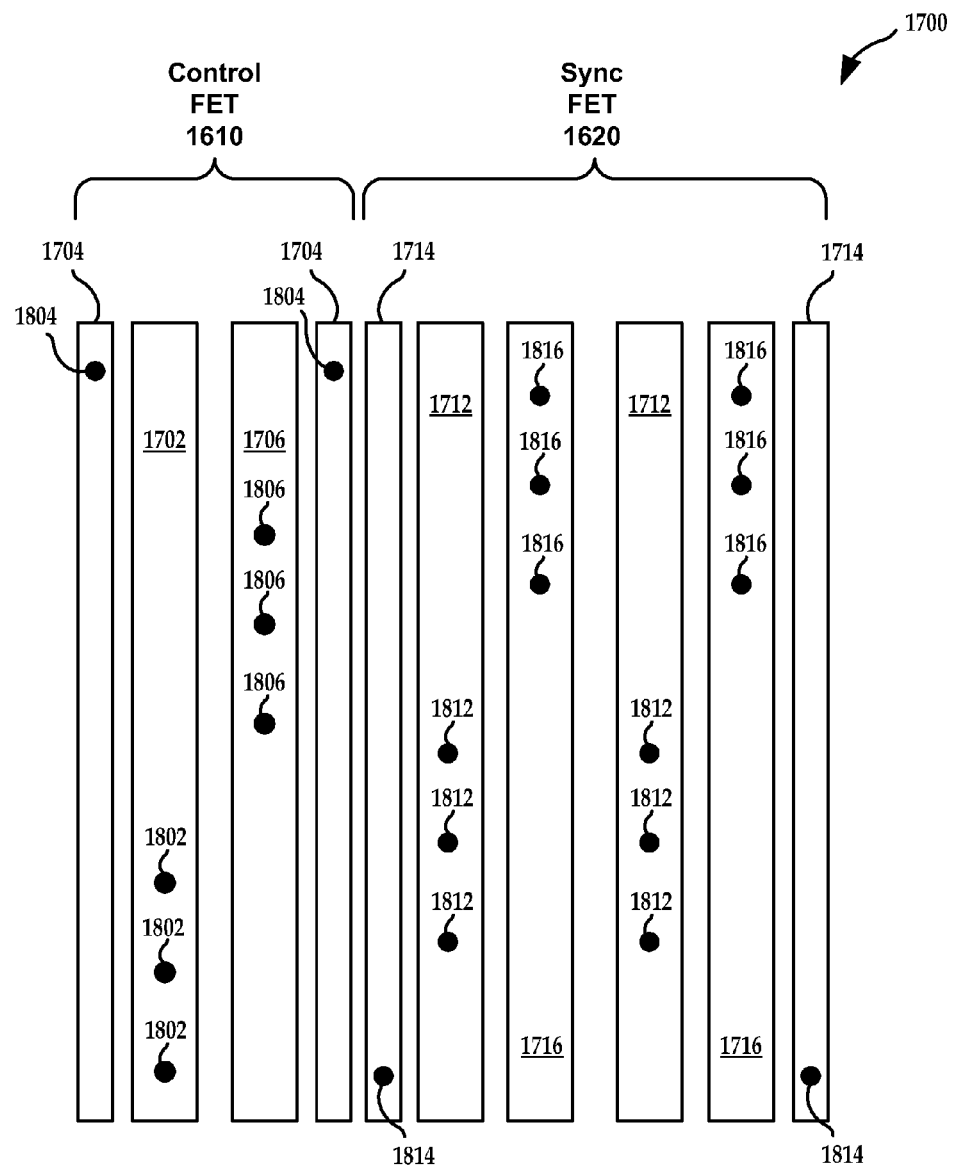
FIG. 18 illustrates a top plan view of the first metal layer of FIG. 17.

FIG. 18 illustrates a top plan view of the first metal layer 1700 of FIG. 17. The ohmic layer 1600 is omitted from FIG. 18 for clarity. The first metal layer 1700 includes drain vias 1802 disposed on the top surface of drain electrodes 1702, source vias 1806 disposed on the top surface of source electrodes 1706, and gate vias 1804 disposed on the top surface gate electrodes 1704 of the control FET 1610. Vias 1802, 1804, and 1806 are omitted from FIG. 17 for clarity. The first metal layer 1700 further includes drain vias 1812 disposed on the top surface of drain electrodes 1712, gate vias 1814 disposed on the top surface of gate electrodes 1714, and source vias 1816 disposed on the top surface of source electrodes 1716, of the sync FET 1620. Vias 1812, 1814, and 1816 are omitted from FIG. 17 for clarity.

Figure 19:
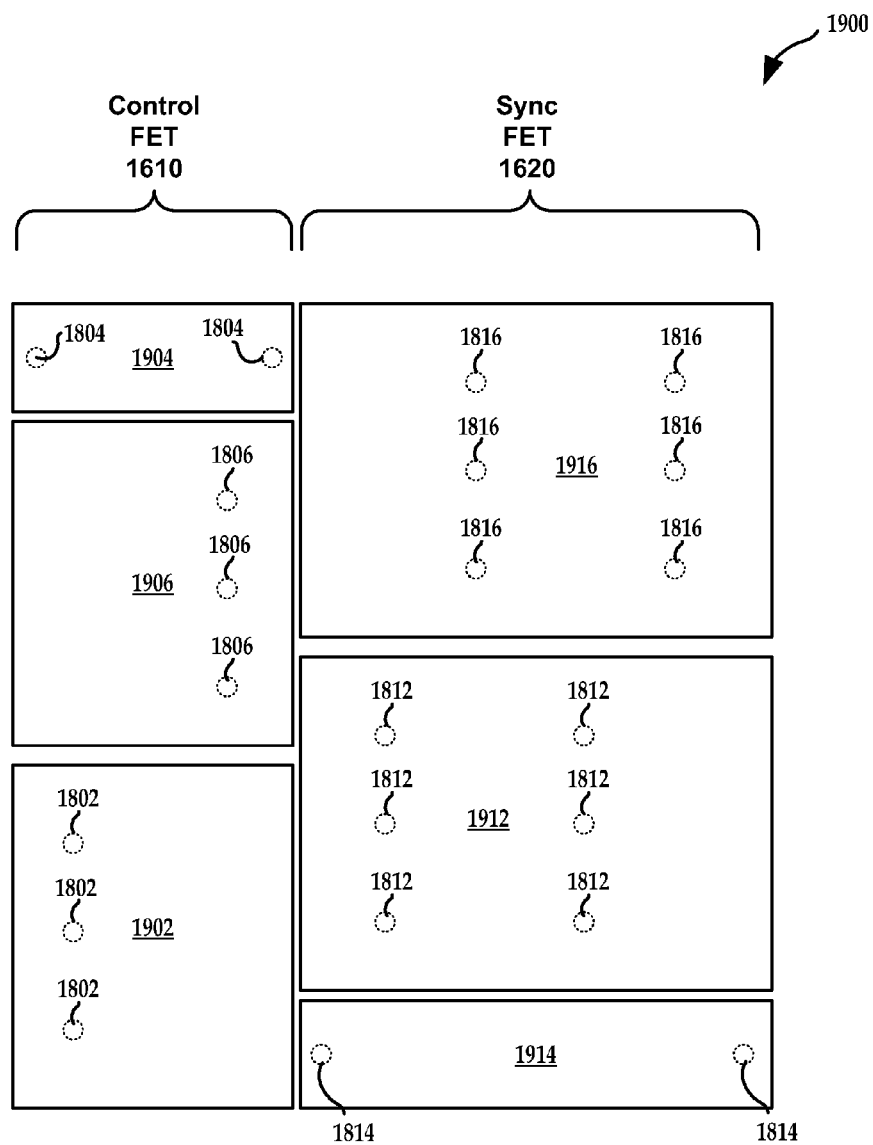
FIG. 19 illustrates a top plan view of a second metal layer.
Figure 20:
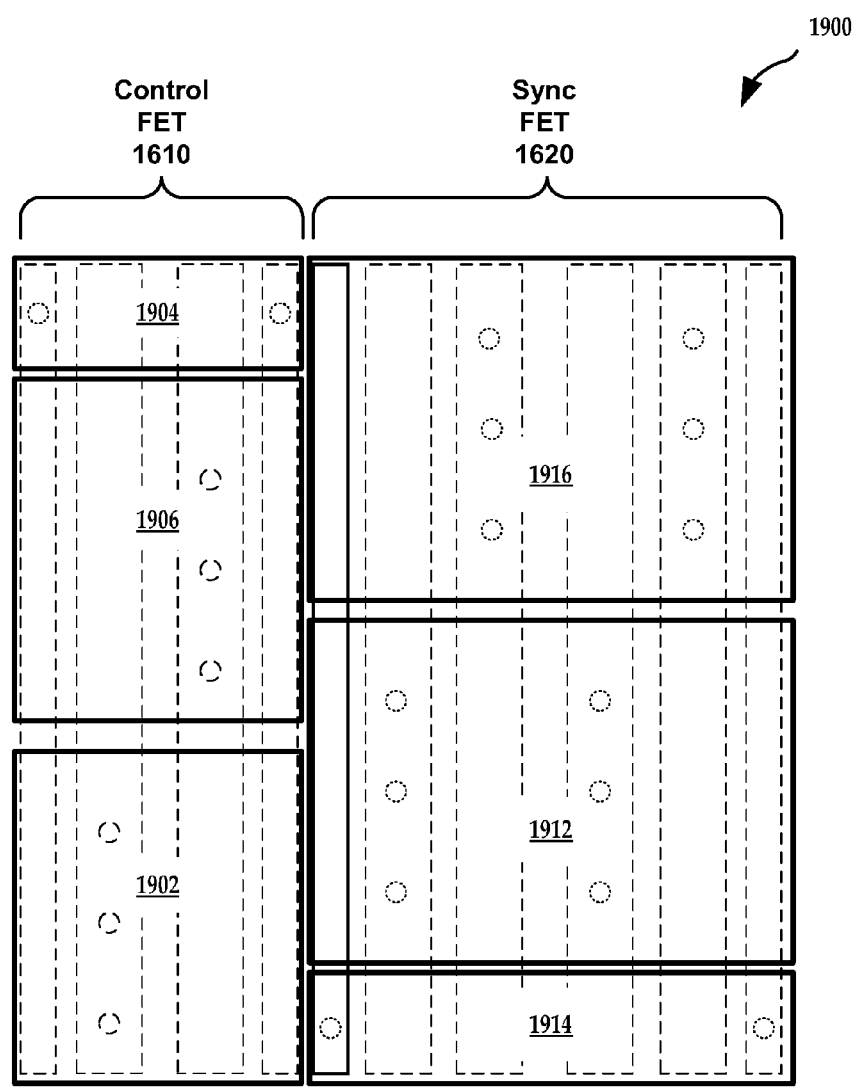
FIG. 20 illustrates the second metal layer in relation to the first metal layer.

FIG. 19 illustrates a top plan view of the second metal layer 1900. The first metal layer 1700 is omitted from FIG. 19 for clarity. FIG. 20 illustrates the second metal layer 1900 in relation to the first metal layer 1700. The second metal layer 1900 may be separated from the first metal layer 1700 using a second dielectric layer 538. The second metal layer 1900 of FIGS. 19 and 20 differs from the second metal layer 540 of FIG. 10 in that the second metal layer 1900 includes source, gate and drain electrodes for two compound semiconductor FET devices, i.e., control FET 1610 and sync FET 1620.

The electrodes of the first metal layer 1700 are illustrated in FIG. 20 in dotted line to indicate that they are below the second metal layer 1900. Vias 1802, 1804, 1806, 1812, 1814, and 1816 are also illustrated in dotted line in FIGS. 19 and 20 to indicate that they are disposed in the second dielectric layer 538 between the first metal layer 1700 and second metal layer 1900. Vias 1802, 1804, 1806, 1812, 1814, 1816 extend through the second dielectric layer 538 to connect the first metal layer 1700 to the second metal layer 1900.

The second metal layer includes a drain connection pad 1902, a source connection pad 1906, and a gate connection pad 1904 for the control FET 1610. The second metal layer further includes a drain connection pad 1912, a gate connection pad 1914 and a source connection pad 1916 for the sync FET 1620.

The drain connection pad 1902 is connected to the drain electrodes 1702 using the drain vias 1802. The drain vias 1802 are illustrated in dotted line to indicate that they are between the drain connection pad 1902 of the second metal layer and the electrodes 1702 of the first metal layer.

The source connection pad 1906 is connected to the source electrodes 1706 using the source vias 1806. The source vias 1806 are illustrated in dotted line to indicate that they are between the source connection pad 1906 of the second metal layer and the source electrodes 1706 of the first metal layer.

The gate connection pad 1904 is connected to the gate electrodes 1704 using the gate vias 1804. The gate vias 1804 are illustrated in dotted line to indicate that they are between the gate connection pad 1904 of the second metal layer and the electrodes 1704 of the first metal layer.

The drain connection pad 1912 is connected to the drain electrodes 1712 using the drain vias 1812. The drain vias 1812 are illustrated in dotted line to indicate that they are between the drain connection pad 1912 of the second metal layer and the electrodes 1712 of the first metal layer.

The gate connection pad 1914 is connected to the gate electrodes 1714 using the gate vias 1814. The gate vias 1814 are illustrated in dotted line to indicate that they are between the gate connection pad 1914 of the second metal layer and the electrodes 1714 of the first metal layer.

The source connection pad 1916 is connected to the source electrodes 1716 using the source vias 1816. The source vias 1816 are illustrated in dotted line to indicate that they are between the source connection pad 1916 of the second metal layer and the electrodes 1712 of the first metal layer. An example of a monolithic dual device for a circuit including a control FET and sync FET for a buck converter circuit is presented. However, other circuits containing two or more FET devices may be fabricated using the dual device layout, via design, integral source-drain finger, and serpentine gates technologies disclosed. For example, if two separate switch devices were fabricated on the same die for independent operation and not specifically intended to work together as a control/sync pair, then the source fingers of the control FET may not be connected to the drain fingers of the sync FET in the ohmic layer. Further, if two or more completely independent switches are fabricated on the same die, then there may not be an interconnection of fingers from one device to the other in the ohmic metal layer. In such case, there would be no node 1630 (as illustrated in FIGS. 16 and 17) connecting the control source finger 1606 to the sync drain finger 1612.

However, in some embodiments, the switch devices may operate in parallel (rather than in series as illustrated in the drawings. In such a case the respective top level pads may be connected together in the second metal layer, e.g., as illustrated in FIG. 21.

Figure 21:
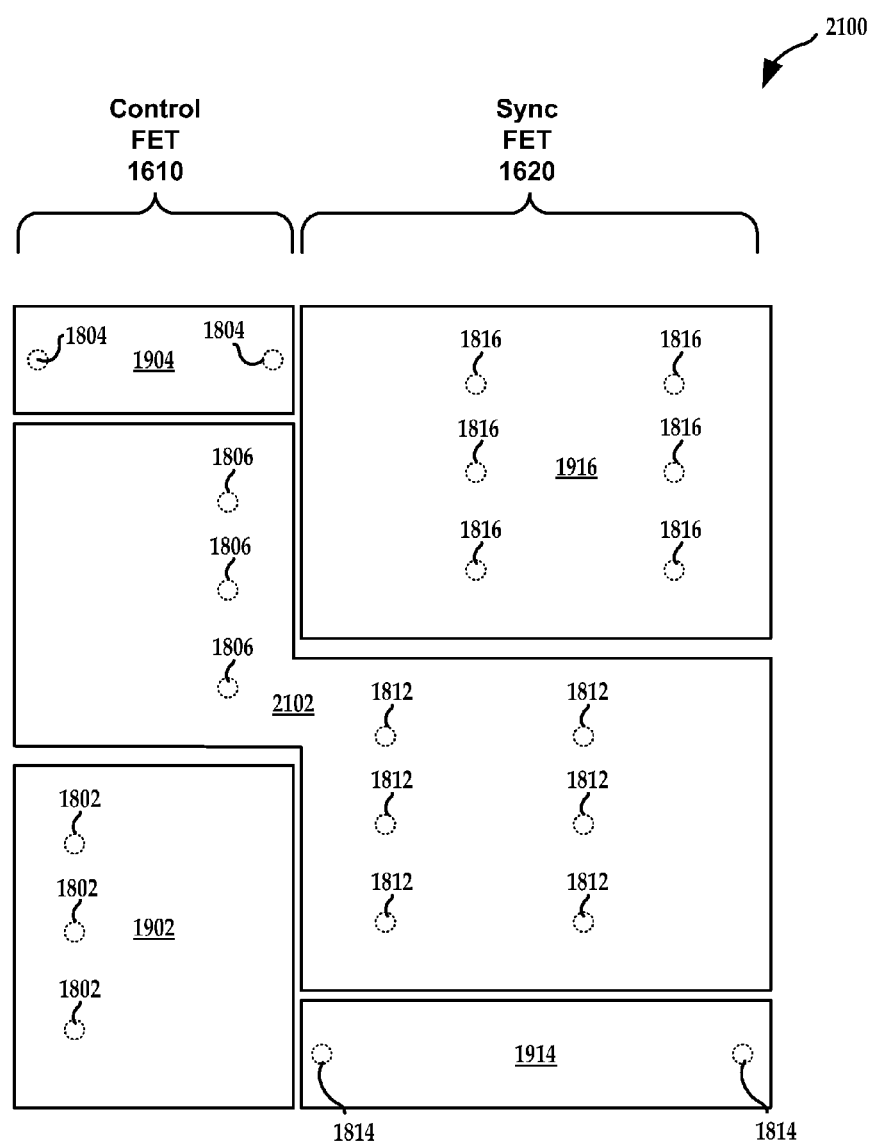
FIG. 21 illustrates a top plan view of an alternative embodiment of the second metal layer.

FIG. 21 illustrates a top plan view of an alternative embodiment of a second metal layer 2100. The second metal layer 2100 of FIG. 21 differs from the second metal layer 1900 of FIG. 19 in that the source connection pad 1906 (control FET) and the drain connection pad 1912 (sync FET) form a single electronically continuous connector pad 2102. Thus, the source fingers 1606 of the control FET, which form a continuous finger with the drain fingers 1602 of the sync FET may be electronically coupled through a single connector pad 2102 to external components. This may reduce the number of contacts for using the sync FET and control FET from six to five contacts, i.e., control gate connection pad 1904, the sync gate connection pad 1914, the control drain connection pad 1902, the sync source connection pad 1916 and switch node connection pad 2102.

Figure 22:
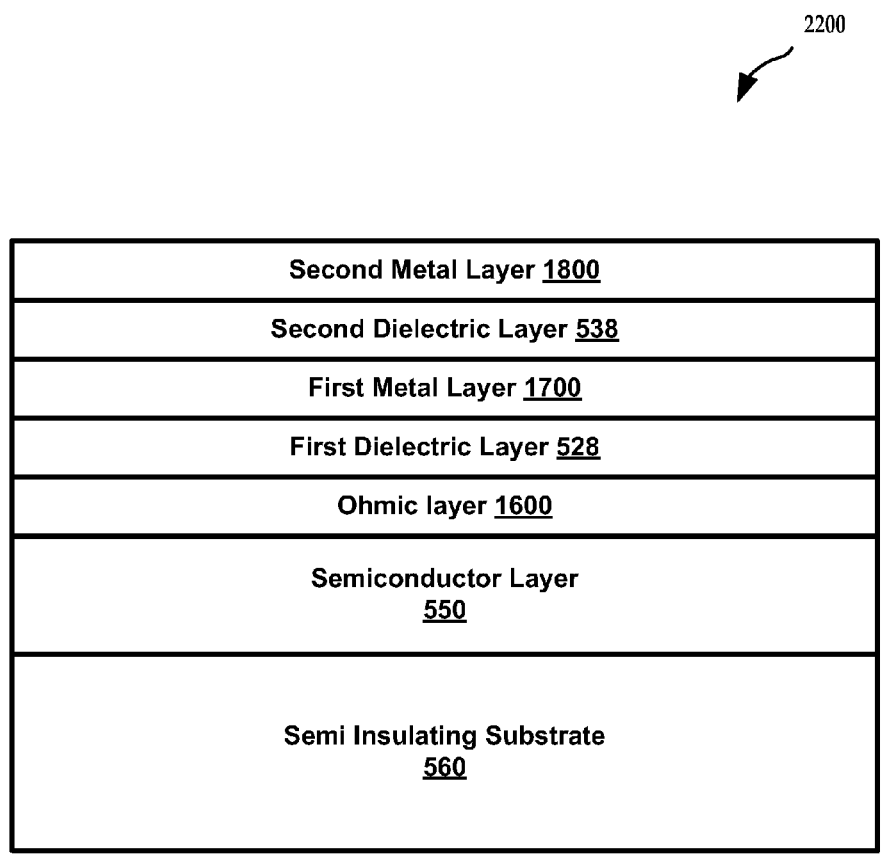
FIG. 22 is a block diagram illustrating layers of a side elevation of a FET device of FIGS. 16-21.

FIG. 22 is a block diagram of a side elevation illustrating layers of a FET device 2200 of FIGS. 16-21. As discussed elsewhere herein, the vias 1622-1636 (not visible in FIG. 22) extend through the first dielectric layer 528 to connect features in the ohmic layer 1600 to electrodes in the first metal layer 1700. Similarly, vias 1802-1816 (not visible in FIG. 22) extend through the second dielectric layer 538 to connect electrodes in the first metal layer 1700 to connection pads in the second metal layer 1900.

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person having ordinary skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

The above description is illustrative and not restrictive. This patent describes in detail various embodiments and implementations of the present invention, and the present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. Moreover, embodiments illustrated in the figures may be used in various combinations. Any limitations of the invention should, therefore, be determined not with reference to the above description, but instead should be determined with reference to the appended claims along with their full scope of equivalents.

What is claimed is:

1. A dual Field Effect Transistor (FET) device comprising:
a compound semiconductor layer;
a control FET fabricated on the compound semiconductor layer, the control FET including a source region, a drain region and a gate region, the control FET further comprising:
an ohmic metal control source finger and an ohmic metal control drain finger disposed on a surface of the compound semiconductor layer in electrical contact with the source region and drain region, respectively,
a control gate finger between the control source finger and the control drain finger, and
a first and second control gate pad at opposite ends of the control gate finger and in electrical contact with the control gate finger;
a sync FET fabricated on the compound semiconductor layer with the control FET as a monolithic device, the sync FET including a source region, a drain region and a gate region, the sync FET further comprising:
an ohmic metal sync source finger and an ohmic metal sync drain finger disposed on the surface of the compound semiconductor layer in electrical contact with the source region and drain region, respectively,
a sync gate finger between the sync source finger and the sync drain finger, and
a first and second sync gate pad at opposite ends of the sync gate finger and in electrical contact with the sync gate finger, the first control gate pad and the first sync gate pad disposed between the control drain finger and the sync source finger; and
an electrical connection between the control source finger and the sync drain finger.

2. The dual FET device of claim 1, further comprising:
a plurality of sync drain vias distributed along the sync drain finger;
a plurality of sync source vias distributed along the sync source finger;
a sync gate via on each of the first and second sync gate pad, respectively;
a plurality of sync drain conductors distributed adjacent the sync drain finger, each sync drain conductor in electrical contact with the sync drain finger through at least one of the sync drain vias;
a plurality of sync source conductors distributed adjacent the sync source finger, each sync source conductor in electrical contact with the sync source finger through at least one of the sync source vias; and
a first and second gate conductor, each in electrical contact through the via on the respective first and second sync gate pad.

3. The dual FET device of claim 2, further comprising:
a plurality of sync drain connector vias distributed along a top surface of the plurality of sync drain conductors;
a plurality of sync source connector vias distributed along a top surface of the plurality of sync source conductors;
a sync gate connector via disposed on a top surface of each of the first and second sync gate conductor, respectively;
a sync drain electrode in electrical contact through the sync drain connector vias with the sync drain conductors;

a sync source electrode in electrical contact through the sync source connector vias with the sync source conductors; and, a gate electrode in electrical contact through the sync gate connector vias with the sync gate conductors.

4. The dual FET device of claim 1, wherein the control source finger and the sync drain finger form a continuous ohmic metal finger including the electrical connection between the control source finger and the sync drain finger.

5. The dual FET device of claim 1, further comprising:
a plurality of control drain vias distributed along a width of the control drain finger;
a plurality of control source vias distributed along a width of the control source finger;
a control gate via on each of the first and second control gate pad, respectively;
a plurality of control drain conductors distributed along the width of the control drain finger, each control drain conductor in electrical contact with the control drain finger through at least one of the control drain vias;
a plurality of control source conductors distributed along the width of the control source finger, each control source conductor in electrical contact with the control source finger through at least one of the control source vias; and
a first and second gate conductor, each in electrical contact through the via on the respective first and second control gate pad.

6. The dual FET device of claim 5, further comprising:
a plurality of control drain connector vias distributed along a top surface of the plurality of control drain conductors;
a plurality of control source connector vias distributed along a top surface of the plurality of control source conductors;
a control gate connector via disposed on a top surface of each of the first and second control gate conductor, respectively;
a control drain electrode in electrical contact through the control drain connector vias with the control drain conductors;
a control source electrode in electrical contact through the control source connector vias with the control source conductors; and,
a gate electrode in electrical contact through the control gate connector vias with the control gate conductors.

7. The dual FET device of claim 1, wherein the length of the control and gate source finger is less than about 7 microns.

8. The dual FET device of claim 1, wherein the length of the of control and sync gate fingers is less than about 0.5 microns.

9. The dual FET device of claim 1, wherein the sync source conductors are about normal to the sync source fingers.

10. The dual FET device of claim 9, wherein the control drain conductors are about parallel to the sync drain conductors and sync source conductors.

11. The dual FET device of claim 1, wherein compound semiconductor material is gallium arsenide or gallium nitride.

12. A Field Effect Transistor (FET) device comprising:
a compound semiconductor layer a plurality of control source fingers and sync source fingers disposed on a surface of the semiconductor layer;
a plurality control drain fingers and sync drain disposed on the surface of the semiconductor layer, the control drain fingers alternating with the control source fingers, and the sync drain fingers alternating with the sync source fingers, each of the plurality of control source fingers integrally connected to and forming a continuous ohmic metal with a corresponding sync drain finger;
a plurality of control gates disposed between adjacent control source fingers and control drain fingers;
a plurality of sync gates disposed between adjacent sync source fingers and sync drain fingers;
a plurality of first control gate pads opposite the control gate fingers from a plurality of second control gate pads, each of the first and second control gate pads configured to couple a control gate signal to two of the control gate fingers, each of the plurality of second control gate pads disposed between one of the plurality of control drain fingers and a respective sync source finger; and
a plurality of first sync gate pads opposite the sync gate fingers from a plurality of second sync gate pads, each of the first and second sync gate pads configured to couple a sync gate signal to two of the sync gate fingers, each of the plurality of second sync gate pads disposed between one of the plurality of control drain fingers and a respective sync source finger.

13. The FET device of claim 12, wherein the length of each of the plurality of gate fingers is less than about 0.5 microns.

14. The FET device of claim 12, wherein the length of each of the plurality of source fingers is less than about 7 microns.

15. The FET device of claim 12, further comprising a plurality of control drain electrodes disposed along a width of the control drain fingers and oriented to cross the plurality of control drain fingers about normally, each control drain electrode electrically coupled through at least one via to a section of each of the control drain fingers.

16. The FET device of claim 12, further comprising a plurality of control source electrodes disposed along a width of the control source fingers and oriented to cross the plurality of control source fingers about normally, each control source electrode electrically coupled through at least one via to a section of each of the plurality of control source fingers.

17. The FET device of claim 12, wherein the compound semiconductor is gallium arsenide or gallium nitride.

18. The FET device of claim 12, further comprising a plurality of sync source electrodes disposed along a width of the sync source fingers and oriented to cross the plurality of sync source fingers about normally, each sync source electrode electrically coupled through at least one via to a section of each of the plurality of sync source fingers.

19. The FET device of claim 12, further comprising a plurality of sync drain electrodes disposed along a width of the sync drain fingers and oriented to cross the plurality of sync drain fingers about normally, each sync drain electrode electrically coupled through at least one via to a section of each of the sync drain fingers.

* * * * *